United States Patent
Yamasaki et al.

(10) Patent No.: US 7,752,748 B2
(45) Date of Patent: Jul. 13, 2010

(54) METHOD FOR DETECTING CONDITION OF NOZZLE MEMBER

(75) Inventors: Noboru Yamasaki, Fukuoka (JP); Kazunori Kanai, Yamanashi (JP); Hidehiro Saho, Saga (JP); Akira Noudo, Fukuoka (JP)

(73) Assignee: Panasonic Corporation, Osaka (JP)

( * ) Notice: Subject to any disclaimer, the term of this patent is extended or adjusted under 35 U.S.C. 154(b) by 489 days.

(21) Appl. No.: 11/664,823

(22) PCT Filed: Oct. 5, 2005

(86) PCT No.: PCT/JP2005/018456

§ 371 (c)(1),
(2), (4) Date: Apr. 6, 2007

(87) PCT Pub. No.: WO2006/040982

PCT Pub. Date: Apr. 20, 2006

(65) Prior Publication Data

US 2009/0119904 A1    May 14, 2009

(30) Foreign Application Priority Data

Oct. 8, 2004    (JP) ............................ 2004-295886

(51) Int. Cl.
*H05K 3/30* (2006.01)
(52) U.S. Cl. .............................. 29/833; 29/832; 29/834; 356/614

(58) Field of Classification Search .................... 29/709, 29/711, 719–720, 740–743, 832–834; 414/783; 901/47; 356/635, 638, 621, 603, 614; 700/213, 700/121; 702/97
See application file for complete search history.

(56) References Cited

U.S. PATENT DOCUMENTS 5,839,186 A * 11/1998 Onodera ....................... 29/720
6,606,788 B1 * 8/2003 Morimoto et al. ............. 29/832

FOREIGN PATENT DOCUMENTS

| JP | 62-263405 | 11/1987 |
| JP | 64-74800 | 3/1989 |
| JP | 1-252328 | 10/1989 |
| JP | 2-222200 | 9/1990 |
| JP | 11-154797 | 6/1999 |
| JP | 2000-15600 | 1/2000 |
| JP | 2004-111421 | 4/2004 |
| JP | 2004-158819 | 6/2004 |

OTHER PUBLICATIONS

Patent Cooperation Treaty (PCT) International Preliminary Report on Patentability, issued Jul. 12, 2007.

* cited by examiner

*Primary Examiner*—Minh Trinh
(74) *Attorney, Agent, or Firm*—Wenderoth, Lind & Ponack, L.L.P.

(57) ABSTRACT

A method for detecting a condition of a nozzle member of a multi-nozzle type component mounting head, in which it is determined that a nozzle is pressed against a load cell when the difference between a measured vertical position of the nozzle and a reference positional information of the nozzle is equal to or greater than a determined value and the measured vertical position of the nozzle is at a lower level position than the reference positional information, and when it is determined that the nozzle is pressed against the load cell, measuring the output value of the load cell.

1 Claim, 23 Drawing Sheets

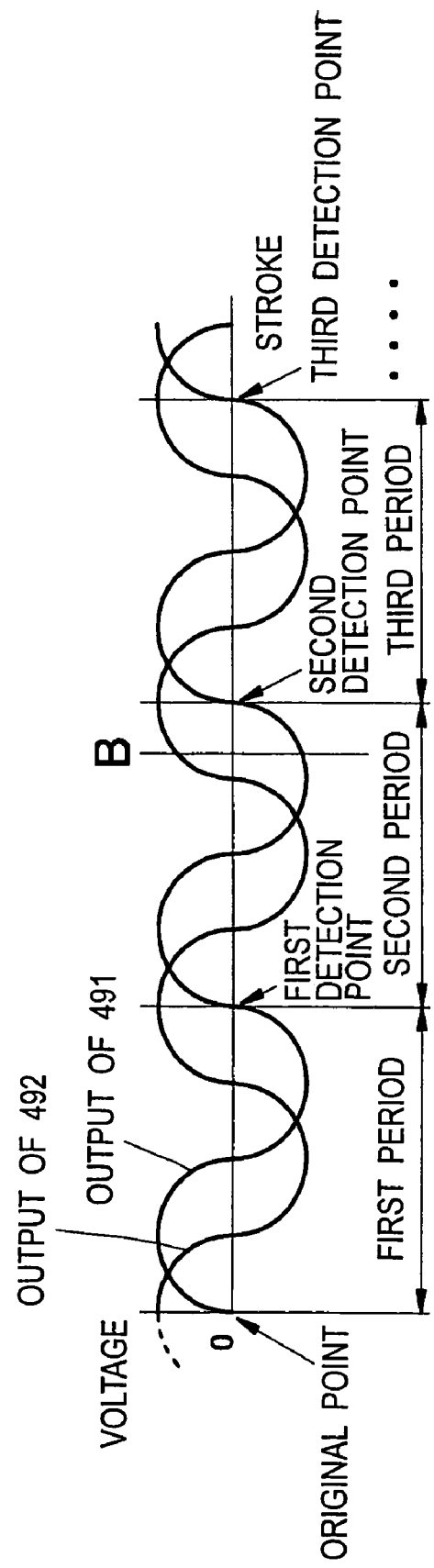

Fig.9C

| NUMBER OF PULSES IN PERIODIC DIRECTION | | RESOLUTION (μm) | MAGNETIC FIELD PERIOD |
|---|---|---|---|
| 0 | ORIGINAL POINT | 8.1 | FIRST PERIOD (8.1mm) |
| 1 | | 8.1 | |
| 2 | | 8.1 | |
| 3 | | 8.1 | |
| ⋮ | ⋮ | ⋮ | |
| 999 | FIRST DETECTION POINT | 8.1 | |
| 0 | | 8.2 | SECOND PERIOD (8.2mm) |
| 1 | | 8.2 | |
| ⋮ | ⋮ | ⋮ | |
| 999 | SECOND DETECTION POINT | | |
| 0 | | 8.1 | THIRD PERIOD (8.1mm) |
| 1 | | 8.1 | |
| ⋮ | ⋮ | ⋮ | |

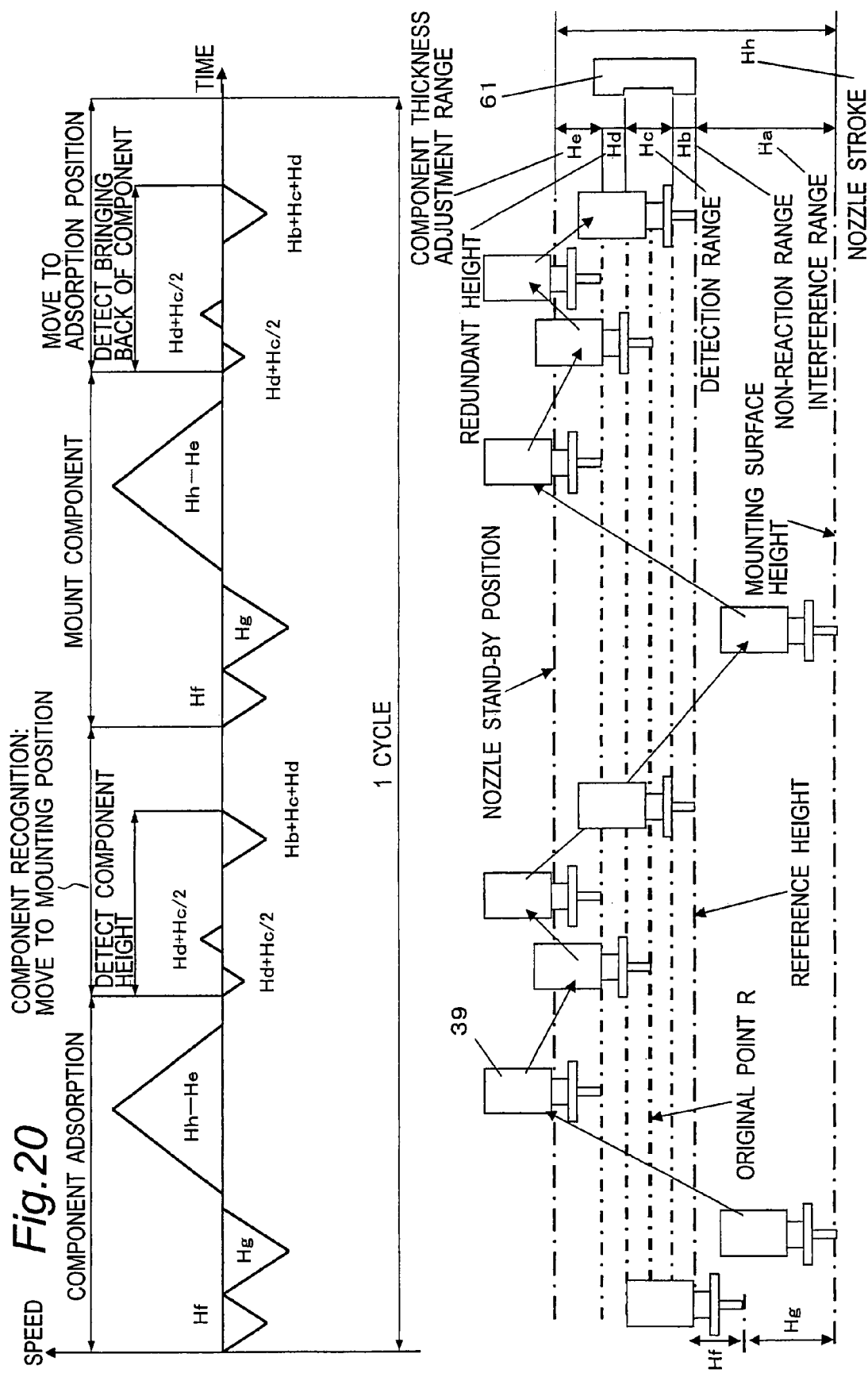

METHOD FOR DETECTING CONDITION OF NOZZLE MEMBER

TECHNICAL FIELD

The present invention relates to, in an apparatus for mounting components provided with a multi-nozzle type component mounting head including a nozzle member having a nozzle, a method for detecting a condition of each nozzle in the nozzle member, a method for detecting a holding posture of the components held by the each nozzle, a method for mounting components to mount the each component on a circuit board based on a result of the detection, and an apparatus for mounting components.

BACKGROUND ART

In recent years, an electronic equipment incorporating an electronic circuit formed by mounting electronic components on a circuit board as a plurality of components is further strongly desired by the market to realize miniaturization, improve its function, and further reduce a cost.

In an apparatus for mounting components including a head part having a nozzle for adsorbing and holding the components, such an electronic circuit is manufactured by mounting with the nozzle the plurality of components on the circuit board held on a stage. Also, in such an apparatus for mounting components, by a detector such as an imaging device and a light shielding sensor provided on the stage or head part, the holding posture of the electronic components and a mounting position of the electronic components on the circuit board are recognized by the head part, and the electronic components are mounted on the circuit board based on the recognition result.

Meanwhile, in such an apparatus for mounting electronic components, in order to respond to a request from the market, the electronic components and the circuit board are further miniaturized, and it is desired to mount the electronic components on the circuit board with high density and high accuracy, and to reduce a manufacturing cost of the electronic circuit by shortening time required for mounting and performing an efficient mounting.

Japanese Patent Application Laid Open No. 62-263405 and Japanese Patent Application Laid Open No. 2004-158819, for example, disclose an apparatus for mounting components provided with a detector for recognizing whether or not the electronic components are held by a nozzle in an appropriate posture so as to mount the electronic components on the circuit board with high density and high accuracy.

Japanese Patent Application Laid Open No. 62-263405 discloses an apparatus for mounting components that detects components held by a nozzle at a fixed position, with a light shielding sensor capable of detecting lengths in two directions of a vertical direction and a horizontal direction.

Also, Japanese Patent Application Laid Open No. 2004-158819 discloses an apparatus for mounting components provided with a line sensor including a light projection part and a light reception part disposed so as to face with each other along a direction perpendicular to an arrangement direction of nozzles, with each component holding member (nozzle) arranged in a line interposed therebetween. This apparatus for mounting components performs detection of each nozzle by sliding the light projection part and the light reception part along the arrangement direction of the nozzles so as to light shield each nozzle.

DISCLOSURE OF THE INVENTION

Problem to be Solved by the Invention

However, in the apparatus for mounting components disclosed in Japanese Patent Application Laid Open No. 62-263405, it is necessary to provide a light reception sensor corresponding to each nozzle. Accordingly, in a case of adopting a multi-nozzle type component mounting head having a plurality of nozzles, the number of the light reception sensors corresponding to the number of the nozzles are required, thus involving a problem of increasing a size of an apparatus and increasing a cost.

Also, the apparatus for mounting components disclosed in Japanese Patent Application Laid Open No. 2004-158819 is used for the multi-nozzle type component mounting head having a plurality of nozzles, and the plurality of nozzles are detected by a line sensor having a pair of light projection/reception parts, thus involving a problem that the light projection part and the light reception part are required to be slid along the arrangement direction of the nozzles.

Accordingly, a technical object of the present invention is to provide, in a multi-nozzle type component mounting head including a plurality of nozzles in a simple structure, a method for detecting a condition of each nozzle capable of being detected by using one sensor, a method for detecting a holding posture of a component held by each nozzle, a method for mounting components to mount each component on a circuit board based on a result of the detection, and an apparatus for mounting components.

Means for Solving the Problem

In order to achieve the above-described technical object, the present invention provides a method for detecting a condition of nozzle members having a structure as will be described below.

According to a first aspect of the present invention, there is provided a method for detecting conditions of nozzle members to detect the condition of the nozzle member of a multi-nozzle type component mounting head including a plurality of nozzle members having movable parts respectively movable vertically and linearly arranged in a direction crossing a direction of the vertical movement, and nozzles for holding components, connected to lower ends of the movable parts respectively and; a moving apparatus for vertically moving each of the plurality of nozzle members individually; a light projector provided on a straight line on which the nozzle members are arranged and on both sides of the plurality of nozzles; and a light receiver for receiving light from the light projector, the method comprising:

moving the nozzle members by the nozzle moving apparatus to make all of the plurality of nozzles retreat in an upper side of an optical path, and making the light receiver receive the light from the light projector without intercepting the light therefrom;

moving an arbitrary one of the nozzle members by the nozzle moving apparatus to descend so that a tip part of the nozzle intercepts the light path and shields the light receiver from the light;

detecting by the height detector the condition of the nozzle member by measuring a vertical directional position of the movable part connected to the nozzle, at a timing when the light receiver detects that light reception and light shielding from the light path are switched by the tip part of the nozzle; and repeating descent and detection for all of the nozzles existing between the light projector and light receiver, and detecting the conditions of all of the nozzle members.

According to a second aspect of the present invention, there is provided a method for detecting conditions of nozzle members to detect a position of the nozzle member of a multi-nozzle type component mounting head including a plurality of nozzle members having movable parts respectively movable vertically and linearly arranged in a direction crossing a direction of the vertical movement, and nozzles for holding components, connected to lower ends of the movable parts respectively; a moving apparatus for vertically moving each of the plurality of nozzle members individually; a light projector provided on a straight line on which the nozzle members are arranged and on both sides of the plurality of nozzles; a light receiver for receiving light from the light projector and constituted by a line sensor extending along a moving direction of the nozzles; and a detection position storage part for storing a relation between an output value of the line sensor and the vertical directional position of the nozzles correspondingly for each of the nozzles, the method comprising:

moving the nozzle members by the nozzle moving apparatus to make all of the plurality of nozzles retreat in an upper side of an optical path, and making the line sensor receive the light from the light projector without intercepting the light therefrom;

moving an arbitrary one of the nozzle members by the nozzle moving apparatus to descend so that a tip part of the nozzle intercepts the light path and shields the line sensor from the light;

detecting by the height detector the condition of the nozzle member by measuring a vertical directional position of the movable part connected to the nozzle, at a timing when the line sensor detects a detection starting output value corresponding to the each nozzle and detects that light reception and light shielding are switched by the tip part of the nozzle; and repeating descent and detection for all of the nozzles existing between the light projector and line sensor, and detecting the conditions of all of the nozzle members.

According to a third aspect of the present invention, there is provided a method for detecting holding of components, comprising:

storing, as reference positional information, information on a vertical position from the height detector at a timing when the light receiver detects that shielding of the light from the light projector is switched for the each nozzle, by using the method for detecting the condition of the nozzle members according to the first aspect or the second aspect without performing an operation of holding the component;

storing, as inspection position information, information on the vertical position from the height detector at a timing when the light receiver detects that shielding of the light from the light projector is switched for the each nozzle, by using the method for detecting the condition of the nozzle member according to the first aspect or the second aspect with performing an operation of holding the component; and detecting a holding condition of the component by the nozzle from a difference between the reference positional information and inspection positional information, and calculating a thickness dimension of the component.

According to a fourth aspect of the present invention, there is provided a method for mounting components, comprising:

calculating a nozzle moving amount when the nozzle takes out the component based on the reference positional information;

calculating a thickness dimension of the component held by the nozzle by using the method for detecting holding of components according to the third aspect;

calculating the nozzle moving amount for mounting the component on a substrate based on the inspection positional information, and moving the nozzle based on a result of the calculation to mount the component.

According to a fifth aspect of the present invention, there is provided a method for mounting components according to the fourth aspect, comprising:

measuring again information on the vertical position of the height detector at a timing when reception and shielding of the light are switched by the nozzle after the nozzle is made to descend to the substrate for mounting the component on the substrate; and determining that the nozzle has defect and canceling mounting of the component, when a difference between the measured vertical position and the reference positional information is a determined value or more.

According to a sixth aspect of the present invention, there is provided the method for mounting components according to fifth aspect, wherein, when the difference between the measured vertical position and the reference positional information is the determined value or more and the measured vertical position is a lower level position than the reference positional information, it is determined that the component is not mounted but held by the nozzle, and an operation of discharging the component is performed.

According to a seventh aspect of the present invention, there is provided the method for mounting components according to fifth aspect, wherein, when the difference between the measured vertical position and the reference positional information is the determined value or more and the measured vertical position is an upper level position than the reference positional information, it is determined that the nozzle is not appropriately connected to the movable part.

According to a eighth aspect of the present invention, there is provided an apparatus for mounting components, comprising:

a multi-nozzle type component mounting head including: a plurality of nozzle members having movable parts respectively movable vertically and linearly arranged in a direction crossing a direction of the vertical movement, and nozzles for holding components, connected to lower ends of the movable parts respectively; a moving apparatus for vertically moving each of the plurality of nozzle members individually; a height detector for detecting vertical positions of the movable parts of the nozzle members; a light projector provided on a straight line on which the nozzle members are arranged and on both sides of the nozzles; and a light receiver for receiving light from the light projector;

an operation control part for operating the nozzle moving apparatus so that all of the nozzles are retreated to an upper side of an optical path from the light projector to set the light receiver in a light reception state, and operating the nozzle moving apparatus to make an arbitrary one of the nozzle members descend;

a measurement control part for measuring the vertical position of the movable part connected to the nozzle by the height detector, at a timing when a tip part of the nozzle intercepts the light path to set the light receiver in a light shielding state and the light receiver detects that a light reception state and a light shielding state are switched by the tip part of the nozzle; and a control calculation part for repeating descent and detection for all of the nozzles existing between the light projector and light receiver by repeating an operation by the operation control part and the measurement control part, and controlling an operation of the multi-nozzle type component mounting head so as to detect a conditions of all of the nozzles.

According to a ninth aspect of the present invention, there is provided an apparatus for mounting components, comprising:

a multi-nozzle type component mounting head including: a plurality of nozzle members having movable parts respectively movable vertically and linearly arranged in a direction crossing a direction of the vertical movement, and nozzles for holding components, connected to lower ends of the movable parts respectively; a moving apparatus for vertically moving each of the plurality of nozzle members individually; a height detector for detecting vertical positions of the movable parts of the nozzle members; a light projector provided on a straight line on which the nozzle members are arranged and on both sides of the nozzles; and a light receiver for receiving light from the light projector and constituted by a line sensor extending along a moving direction of the nozzles;

a detection position storage part for storing a relation between an output value of the line sensor and the vertical position of the nozzle correspondingly for each of the nozzles;

an operation control part for operating the nozzle moving apparatus so that all of the nozzles are retreated to an upper side of an optical path from the light projector to set the light receiver in a light reception state, and operating the nozzle moving apparatus to make an arbitrary one of the nozzle members descend;

a measurement control part for measuring the vertical position of the movable part connected to the nozzle by the height detector, at a timing when a tip part of the nozzle intercepts the light path to set the light receiver in a light shielding state, an output value from the line sensor is a detection start output value corresponding to the each nozzle stored in the detection position storage part and the light receiver detects that a light reception state and a light shielding state are switched; and a control calculation part for repeating descent and detection for all of the nozzles existing between the light projector and light receiver by repeating an operation by the operation control part and the measurement control part, and controlling an operation of the multi-nozzle type component mounting head so as to detect a conditions of all of the nozzles.

According to a tenth aspect of the present invention, there is provided the apparatus for mounting components according to the eighth aspect or ninth aspect, further comprising:

a positional information storage part for storing reference positional information, being information on the vertical position of the height detector at a timing when the light receiver detects that the light reception state and a light shielding state of a light path from the light projector are switched without performing an operation of holding the component, and inspection positional information, being the information on the vertical position of the height detector at a timing when the light receiver detects that a light reception state and a light shielding state of the light path from the light projector are switched with performing the operation of holding the component, wherein the control calculation part detects whether or not the nozzle holds the component by comparing the reference positional information and inspection positional information stored in the positional information storage part during an operation of mounting the component or calculates a thickness dimension of the component, and, based on a calculation result, mounts the component by moving the nozzle.

According to a eleventh aspect of the present invention, there is provided the apparatus for mounting components according to tenth aspect, wherein the control calculation part calculates a nozzle moving amount in the case where the nozzle takes out the component based on the reference positional information;

calculates the thickness dimension of the component held by the nozzle;

calculates the nozzle moving amount in the case where the component is mounted on a substrate based on the inspection positional information, and based on a calculation result, mounts the component by moving the nozzle.

According to a twelfth aspect of the present invention, there is provided the apparatus for mounting components according to eleventh aspect, wherein the control calculation part measures again the information on the vertical position of the height detector at a timing when light shielding of the light from the light projector is switched by the nozzle after the nozzle is made to descend on the substrate for mounting the component on the substrate; and outputs a signal indicating that the nozzle has defect in the case where a value of a difference between the measured vertical position and the reference positional information is not within a prescribed range.

According to a thirteenth aspect of the present invention, there is provided the apparatus for mounting components according to claim 12, wherein the control calculation part outputs a signal indicating that the component is not mounted but held by the nozzle, in the case where the difference obtained by subtracting the reference positional information from the measured vertical position is a prescribed value or more and the measured vertical position is an upper level position than the reference positional information.

According to a fourteenth aspect of the present invention, there is provided the apparatus for mounting components according to twelfth aspect, wherein the control calculation part outputs a signal indicating that the nozzle is not appropriately connected to the movable part, in the case where the difference obtained by subtracting the reference positional information from the measured vertical position is a prescribed value or less and the measured vertical position is a lower level position than the reference positional information.

According to a fifteenth aspect of the present invention, there is provided the apparatus for mounting components according to fourteenth aspect, wherein the nozzle has escape upward in the case where the tip part thereof is urged downward and pressed to an upper side, and further has: a load cell for outputting an output signal in accordance with a pressing strength of the nozzle in the case where the nozzle is pressed against an upper surface; and the control calculation part measures an output value from the load cell by pressing the nozzle against the load cell when it is determined that the nozzle is not appropriately connected to the movable part, and in the case where the difference between a previously stored output value from the load cell and the output value from the load cell is not within a prescribed range, determines that the escape of the nozzle does not function.

According to a sixteenth aspect of the present invention, there is provided a method for detecting a condition of a nozzle member to detect the condition of the nozzle member of a multi-nozzle type component mounting head including: a plurality of nozzle members having movable parts respectively movable vertically and linearly arranged in a direction crossing a direction of the vertical movement, and nozzles for holding components, connected to lower ends of the movable parts respectively; a moving apparatus for vertically moving each of the plurality of nozzle members individually; a height detector for detecting vertical positions of the movable parts of the nozzle members; a light projector provided on a straight line on which the nozzle members are arranged and on both sides of the plurality of nozzles; and a line sensor for receiving light from the light projector and extending along a moving direction of the nozzles, the method comprising:

moving the nozzle members by the nozzle moving apparatus to make all of the plurality of nozzles retreat in an upper part of an optical path, and making the line sensor receive the light from the light projector without intercepting the light therefrom;

making the nozzle members descend by the nozzle moving apparatus on an optical axis between the light projector and line sensor sequentially one by one, so that the tip parts of the nozzles intercept the optical path;

detecting positions of the nozzle tip parts by the line sensor at a timing when the height detector detects that the positions of the movable parts correspond to an inspection height; and repeating descent and detection for all of the nozzles existing between the light projector and light sensor, and detecting the conditions for all of the nozzle members.

According to a seventeenth aspect of the present invention, there is provided the method for detecting a condition of a nozzle member according to sixteenth aspect, further comprising:

a detection position storage part for storing a relation between an output value of the line sensor and a vertical position of the nozzle correspondingly for the each nozzle, wherein jig components having an already known thickness are held by the plurality of nozzles, and thickness of the jig components is detected based on an output of the line sensor when the positions of the movable parts correspond to the inspection height, information on a correction amount for each nozzle position and the correction amount for the each nozzle position are stored in the detection position storage part based on a difference between thickness information on the detected jig components and previously obtained thickness information on the jig components, and when the thickness of components to be mounted are detected by the line sensor, based on the information on the correction amount, the thickness of the components is calculated.

According to a eighteenth aspect of the present invention, there is provided the method for detecting conditions of a nozzle members according to sixteenth aspect, wherein the detected nozzle height is compared with a value previously detected, and when a difference of a determined value or more is generated, the nozzle is determined to have abnormality.

According to a nineteenth aspect of the present invention, there is provided the method for detecting a condition of a nozzle member according to eighteenth aspect, wherein the nozzle is has escape upward when the tip part thereof is urged downward and pressed to an upper side, and further has a load cell for outputting an output signal in accordance with a pressing strength of the nozzle by being pressed by the nozzle, when the nozzle is determined to have abnormality, the nozzle is pressed against the load cell and an output value from the load cell is measured; and when the difference between the output value from the load cell previously stored and the output value from the load cell is not within a prescribed range, it is determined that the escape of the nozzle does not function.

Effect of the Invention

According to the first aspect, the eighth aspect, and the sixteenth aspect of the present invention, one set of light projector and light receiver are provided along the arrangement direction of the nozzle members. Therefore, all the nozzles arranged by these light projector and light receiver can be detected. In this case, a plurality of nozzles exist on a light path from the light projector, and therefore during detection, all the nozzles are retreated from the light path and the nozzles desired to be detected are descended one by one, to move the nozzles into the light path and switch the light receiver between a light reception state and a light shielding state. Thus, an absolute position of a tip part (lower end of the component when the component is held by the nozzle) of the nozzle member relative to the multi-nozzle type component mounting head can be detected.

In the first aspect and the eighth aspect, the light receiver may be a photo sensor for detecting whether or not it receives light of one optical axis from the projector, or may be one for detecting a light reception quantity of the light including a plurality of optical axes such as a CCD sensor. In addition, it is also possible to use a light quantity sensor for detecting a light shielding quantity by the nozzles, according to a light quantity inputted in a sensor. Namely, in the case where the photo sensor is used as the light receiver, whether or not the one optical axis made incident on the photo sensor is shielded is detected, and it is detected to be a light shielding state when it is shielded, while it is detected to be a light reception state when it is not shielded. In the case where the CCD sensor is used, it is detected which scanning line is shielded out of a large number of scanning lines emitted from the light emitter. Then, a previously defined position is set as a threshold value between the light reception state and the light shielding state, and the CCD sensor detects by comparing this previously defined position and a position of a border between light shielding and light reception by a detected nozzle. Further, when the light quantity sensor is used, the light quantity reaching the light quantity sensor is detected. Then, the light reception state and the light shielding state are detected by a size relation between an output value from the sensor and the previously defined value as the threshold value between the light reception state and the light shielding state.

The light receiver and the light projector are provided so as to be fixed to the multi-nozzle type component mounting head. Therefore, for example, at a timing when the state of the light receiver is switched between the light reception state and the light shielding state, this nozzle exists at the fixed absolute position with respect to the multi-nozzle type component mounting head. At this position, by measuring a vertical directional position of a movable part connected to this nozzle by the height detector, a positional relation between the nozzle and the movable part is clarified, and the condition of the nozzle member can be detected. Note that, when the vertical directional position of the movable part is measured by moving the nozzle to the position where light reception and light shielding are switched, this nozzle is not required to stop, but the vertical directional position may be measured by the height detector at a timing when light reception and light shielding are switched while the nozzle is moving to a target position. Further, in order to detect the nozzle, a switching timing of the light receiver from the light reception state to the light shielding state may be detected while the nozzle is being descended. Alternately, the switching timing of the light receiver from the light shielding state to the light reception state may be detected while the nozzle is moving upward to return to an original retreat position after being descended once.

According to the sixteenth aspect, by detecting the position of the nozzle by the line sensor at a timing when the movable part is detected to exist at an inspection height by the height detector, the positional relation between the nozzle and the movable part is clarified, and the condition of the nozzle member can be detected.

Therefore, according to the present invention, by using the one set of light projector and the light receiver, a lower end position of the nozzle or the component adsorbed and held by the nozzle is detected, and the conditions of a plurality of nozzles such as breaking, bending, and chipping, can be detected. This contributes to making this detection mechanism simple at a reduced cost.

According to the second aspect and the ninth aspect of the present invention, the light receiver has the line sensor extending along the moving direction of the nozzle. Therefore, the output value of the line sensor can be appropriately set when the condition of the nozzle is detected. Namely, a distance from the light projector and the light receiver to the nozzle, being a detection object, in the multi-nozzle type component mounting head having the aforementioned structure is different for each nozzle. Accordingly, when the light from the light receiver is diffused, the nozzle does not necessarily exist at the same position even if the output value of the light receiver is the same, and accuracy of detection would be sometimes deteriorated. Therefore, the output value of the line sensor at the position where the detection is performed for each nozzle is previously stored, and the timing when this value is obtained is defined as the timing when light shielding and light reception are switched. Namely, at a timing when an output from the line sensor becomes a previously stored detection start output value, information thus stored is referenced and the position corresponding to each different nozzle in a direction of the optical axis can thereby be set. Accordingly, accuracy of detection can be further improved.

According to the third aspect and the tenth aspect of the present invention, a thickness dimension of the component can be obtained by calculation, by comparing the information on the vertical directional position of the movable part between the condition of holding the components and the condition of not holding the components to obtain a difference therebetween. Namely, since a length of the nozzle member is fluctuated according to existence/non-existence of the components, the thickness dimension of the component can be calculated by comparing reference positional information on the vertical directional position of the movable part corresponding to the each nozzle and inspection positional information. Moreover, in a case where the difference between the reference positional information and the inspection positional information is significantly small, it can be so determined that the component is not held by the nozzle when the reference positional information and the inspection positional information are measured respectively. Therefore, it can be detected whether or not the component is held by the nozzle.

According to the fourth aspect and the eleventh aspect of the present invention, based on the reference positional information on the vertical directional position in a state of not holding the component, a nozzle moving amount for taking out a component by the nozzle is calculated, and based on the inspection positional information on the vertical directional position in a state of holding the component, a nozzle moving amount for mounting the component on the substrate is calculated, thereby making it possible to control an accurate descending width of the nozzle and perform an accurate mounting operation. Specifically, for example, the reference positional information may show the vertical directional position of the movable part at the timing when the nozzle is descended to adsorb and hold the component and the light to the light receiver is shielded, and the inspection positional information may show the vertical directional position of the movable part at the timing when the light to the light receiver is switched from light shielding to light reception while the nozzle is moving upward to return to an original stand-by position in order to mount the component on the substrate after adsorbing and holding the component. By thus performing inspection, the thickness dimension of the component and the existence/non-existence of adsorption and holding operations can be measured during mounting operation of the nozzle.

According to the fifth aspect and the twelfth aspect of the present invention, it can be determined whether or not the nozzle has a defect due to repeated mounting operations. Namely, in some cases, the condition of the nozzle changes while performing the mounting operations. In this case, for example, by measuring the vertical directional position of the movable part at the timing when the nozzle returns to the stand-by position after being descended for the mounting operation and at the timing when the light to the light receiver is switched from light shielding to light reception, the condition of the nozzle can be detected.

According to the sixth aspect and the thirteenth aspect of the present invention, in a case where defect of the nozzle is detected, the component is in a state of being held by the nozzle if the difference between the measured vertical directional position and the reference positional information is a prescribed value or more and the measured vertical directional position is a lower level position than the reference positional information. Therefore, such a condition can be determined to indicate a state of bringing back the component because of an error in mounting the component on the substrate, and outflow of a substrate defect due to missing a component can be prevented beforehand.

According to the seventh aspect and the fourteenth aspect of the present invention, when the difference between the measured vertical directional position and the reference positional information is a predetermined value or more and the measured vertical directional position is an upper level position than the reference positional information, the position of the tip part of the nozzle moves to an upper side of the reference positional information. Therefore, for example, it is so determined that breaking and bending occurs to the nozzle, and the mounting operation by this nozzle can be stopped. Accordingly, accuracy of mounting can be improved.

According to the fifteenth aspect of the present invention, when the nozzle is made to be able to escape to an upper side, it is considered that the escape does not function since the tip part of the nozzle escapes to the upper side and does not return to the original position, when the difference between the measured vertical directional position and the reference positional information is a prescribed value or more and the measured vertical directional position is the upper level position than the reference positional information. In this case, by pressing the nozzle onto a load cell and measuring its output, the condition of the tip part of the nozzle can be detected.

BRIEF DESCRIPTION OF THE DRAWINGS

These and other aspects and features of the present invention will become clear from the following description taken in conjunction with the preferred embodiments thereof with reference to the accompanying drawings, in which:

FIG. 9B is a view showing an example of an output signal of each magnetic pole sensor of FIG. 9A.

FIG. 9C is a view showing a constitutional example of a resolution table of each period.

FIG. 20 is a timing chart on a vertical drive of the nozzle, the nozzle height, and a rise/fall speed of the nozzle of the apparatus for mounting components of FIG. 1.

BEST MODE FOR CARRYING OUT THE INVENTION

Figure 1:
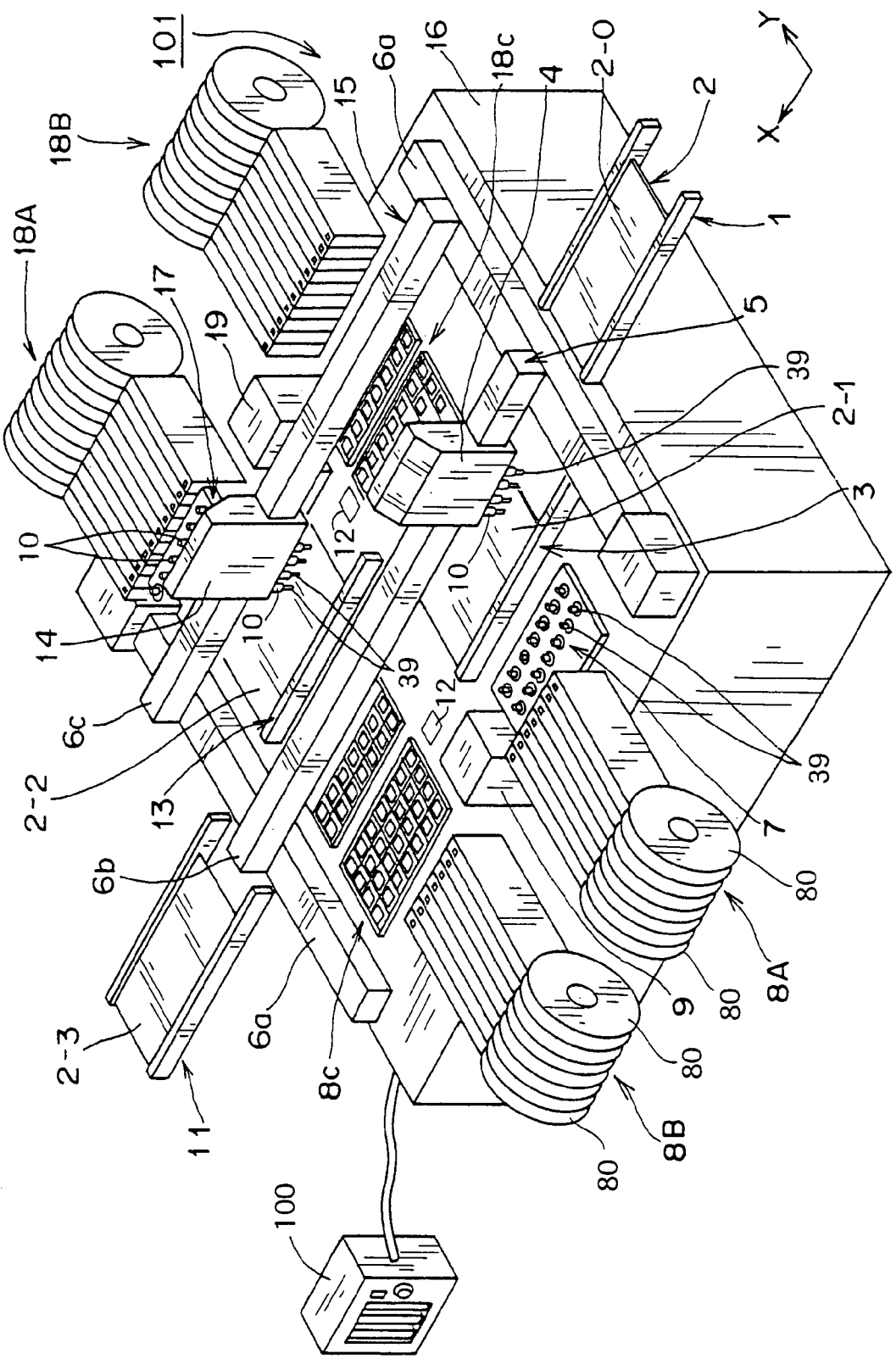
FIG. 1 is a schematic perspective view of an entire body of an apparatus for mounting components according to a first embodiment of the present invention.

Before the description of the present invention proceeds, it is to be noted that like parts are designated by like reference numerals throughout the accompanying drawings.

FIG. 1 is a schematic perspective view of an entire body of a component mounting apparatus 101 according to a first embodiment of the present invention. The component mounting apparatus 101 includes a loader 1 for carrying a circuit board 2 in the component mounting apparatus 101, an unloader for carrying the circuit board 2, on which the components are mounted, from the component mounting apparatus 101, and a first substrate carrying holder 3 provided with a pair of support rails carrying and holding the circuit board 2 carried from the loader 1 during mounting of the components on the circuit board 2. FIG. 1 simultaneously shows a state that the loader 1 mounts the circuit board and a circuit board 2-0 is carried to the component mounting apparatus 101, a state that the first substrate carrying holder 3 mounts the circuit board and the components are mounted on a circuit board 2-1, and a state that a circuit board 2-3 on which the components are mounted is carried from the component mounting apparatus 101. Note that in an explanation hereafter, when the circuit board is shown irrespective of the position, such a circuit board is shown as "a circuit board 2", and when the circuit board positioned at a specified position, such a circuit board is shown as "circuit boards 2-0, 2-1, 2-2, or 2-3".

Further, the component mounting apparatus main body 101 is respectively disposed on an end portion of the front side in a Y-axial direction as shown in the figure, being the front side of a worker, in a component mounting working area, and includes a component supply part having a plurality of component supply cassettes 80 for continuously and sequentially supplying a plurality of components to be mounted on the circuit board 2 to a component extract position, and a component supply part 8C for placing on a tray the components to be mounted on the circuit board 2. Not that the components supplied from each of the component supply cassettes 80 in a component supply parts 8A and 8B are mainly small size chip components. Meanwhile, the components supplied from a component supply part 8C are different shaped components, etc., such as an IC component and a connector, etc., mainly represented by an IC chip, for example.

In addition, the component mounting apparatus main body 101 includes a fitting part having the component supply parts 8A and 8B for supplying a component 2 fitted thereto; a first head part 4 for adsorbing the components supplied from the component supply parts 8A, 8B, and 8C and mounting them on the circuit board 2; a recognition camera 9 as an example of an imaging apparatus disposed on the side close to the center of the component mounting working area in the vicinity of the component supply part 8A, for imaging an adsorption posture of the component adsorbed and held by a nozzle part 39 provided on the tip part of each of the adsorption nozzle assemblies 10 in the first head part 4.

The first head part 4 is movably constituted by an XY robot 5 for positioning at a prescribed position in the X-axis direction and the Y-axis direction, being perpendicular two directions in the component mounting working area and an upper surface of the apparatus in the component mounting apparatus 101. The first head part is the multi-nozzle type component mounting head detachably equipped with a plurality of nozzle parts 39, such as twelve nozzle parts 39, escapably adsorbing and holding the components, so as to be exchanged. The first head part 4 can two-dimensionally move in the component mounting working area by the XY robot 5, and for example, can move to a component supplying position of the component supply parts 8A, 8B, and 8C for adsorbing and holding the components supplied form the component supply parts 8A, 8B, and 8C, to the first substrate carrying holder 3 for mounting the components on the circuit board 2-1 held by the first substrate carrying holder 3, and to an upper side of a nozzle station 7 for exchanging the nozzle part 39 attached to the head part 4 as needed. Note that the nozzle station 7 is disposed in the vicinity of the component supply part 8A in the component mounting working area, on which a plurality of kinds of nozzle parts 39 adapted to a plurality of kinds of components are placed.

Further, the component mounting apparatus 101 as shown in FIG. 1 includes a second substrate carrying holder 13 provided with a pair of support rail parts for receiving, carrying and holding the circuit board 2-1 carried from the first substrate carrying holder 3; a second head part 14 removably having a plurality of, for example, twelve adsorption nozzle assemblies 10 for releasably adsorbing and holding the components; an XY robot 15 for positioning the second head 14 in the X-axial direction and the Y-axial direction; a nozzle station 17 disposed in the vicinity of the component supply part 18A, for placing thereon a plurality of kinds of nozzle parts 39 suitable for a plurality of kinds of components and exchanging them with the nozzle parts 39 equipped in the head part 14 as needed; component supply parts 18A and 18B having a plurality of component supply cassettes 80 respectively disposed on the end portion of the depth side in the Y-axial direction as shown in the figure, being the depth side with respect to a worker in the component mounting work area, for continuously supplying a component 23 to be mounted on the circuit board 2-1, to a component supply position 81, one by one; a component supply part 18C disposed in the vicinity of the component supply part 18B, for storing tray components storing and holding the components to be mounted on the circuit board 2 in a tray shape; and a recognition camera 19 disposed on the side closer to the center of the component mounting work area in the vicinity of the component supply part 18A, for imaging an adsorption posture of the component 23 adsorbed by the nozzle part 39 of the second head part 14, respectively. In addition, load cells 12 are provided at two places, for measuring a load when contacted by the nozzle parts 39 of the first head part and the second head part 14 and adjusting the heights of the nozzle parts 39.

In this way, the component mounting apparatus 101 has two component mounting work areas disposed on an upper surface of a mounting apparatus base stand 16, thus making it possible to apply a component mounting operation simultaneously and individually to each circuit board 2 held by the first substrate carrying holder 3 and the second substrate carrying holder 13, respectively.

Next, constitutions of the head parts 4 and 14 will be explained in detail. Note that since the first head part 4 and the second head part 14 have the same constitutions, the constitution of the first head part 14 is explained on behalf of the second head part 14, by using a partial perspective view of the first head part 4 as shown in FIG. 2.

Figure 2:
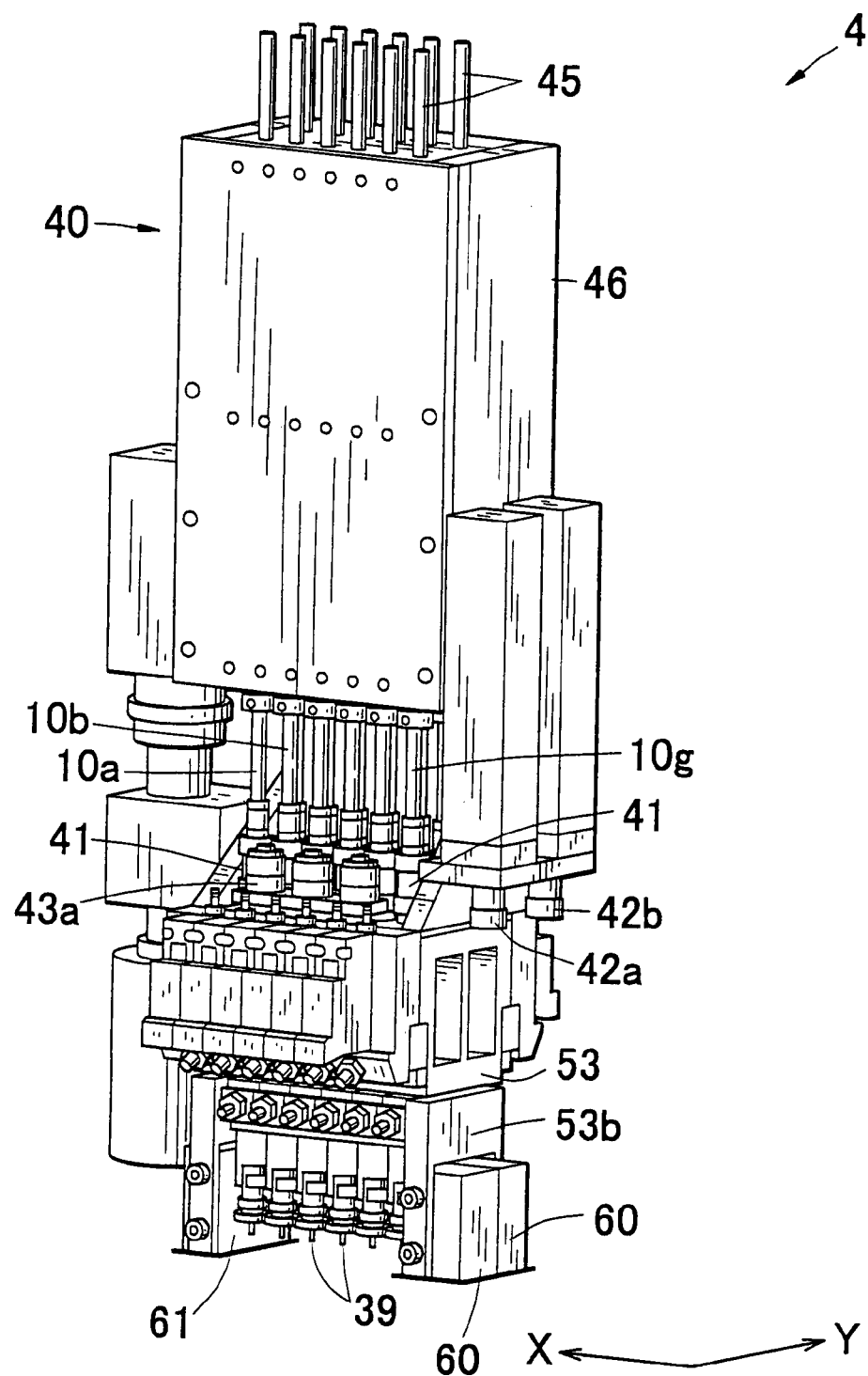
FIG. 2 is a perspective view showing an external appearance of a first head part of the apparatus for mounting components of FIG. 1.
Figure 3:
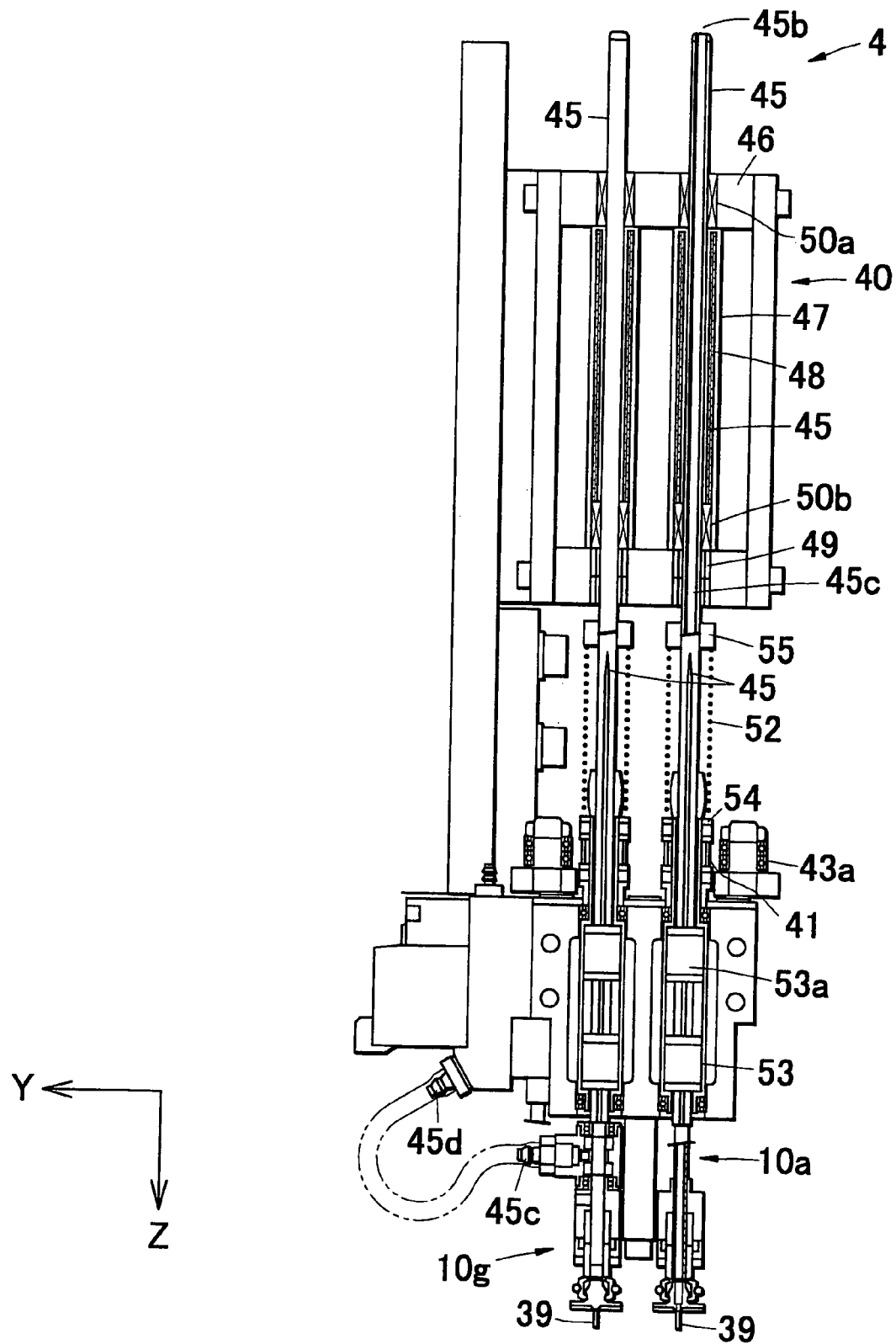
FIG. 3 is a sectional view in a Y-direction of the first head part of FIG. 2.

As shown in FIG. 2 and FIG. 3, the first head part 4 is a multiple type head part, in which a plurality of, for example, twelve adsorption nozzle assemblies 10 are arranged, with six lines of them along the X-axial direction in the figure at constant interval pitches Px, and two lines of them along the Y-axial direction in the figure at constant interval pitches Py. Each of the adsorption nozzle assemblies 10 of the first head part 4 is defined as a first adsorption nozzle assembly 10a, a second adsorption nozzle assembly 10b, a third adsorption nozzle assembly 10c, a fourth adsorption nozzle assembly 10d, a fifth adsorption nozzle assembly 10e, and a sixth adsorption nozzle assembly 10f, sequentially from the front side in the Y-axial direction in the figure and the left side in the X-axial direction in the figure to the right side, and is defined as a seventh adsorption nozzle assembly 10g, an eighth adsorption nozzle assembly 10h, a ninth adsorption nozzle assembly 10i, a tenth adsorption nozzle assembly 10j, an eleventh adsorption nozzle assembly 10k, and a twelfth adsorption nozzle assembly 10l sequentially from the depth side in the Y-axial direction in the figure and the left side in the X-axial direction in the figure to the right side. In addition, in the component supply part 8A (or 8B), a plurality of component supply cassettes 80 are arranged along the X-axial direction in the figure at constant interval pitches L. Moreover, the constant interval pitch Px in the arrangement of each adsorption nozzle assembly 10 may be integer times of or one-integer of the constant interval pitch L in the arrangement of each of the adsorption nozzle assemblies 10, and in this embodiment, the interval pitch Px and the interval pitch L have the same dimensions. Note that in the explanation as will be given hereunder, when the first adsorption nozzle assembly 10a to the twelfth adsorption nozzle assembly 10l are not specified, they are called simply "adsorption nozzle assembly 10".

In addition, the first adsorption nozzle assembly 10a to the twelfth adsorption nozzle assembly 10l have approximately the same constitution with each other, and they can be moved in an axial direction by a casing 46 provided in an upper part of the first head part 4 and an outer cylinder 53 provided with a ball spline nut 53a, and they can be held rotatably around an axis. As will be described later, the adsorption nozzle assembly 10 is constituted so as to be vertically moved in its axial direction (in the Z-axial direction) by an actuator 40 provided in the casing, and has a spline shaft 44 so as to carry out $\theta$ rotations around its axis.

Figure 4:
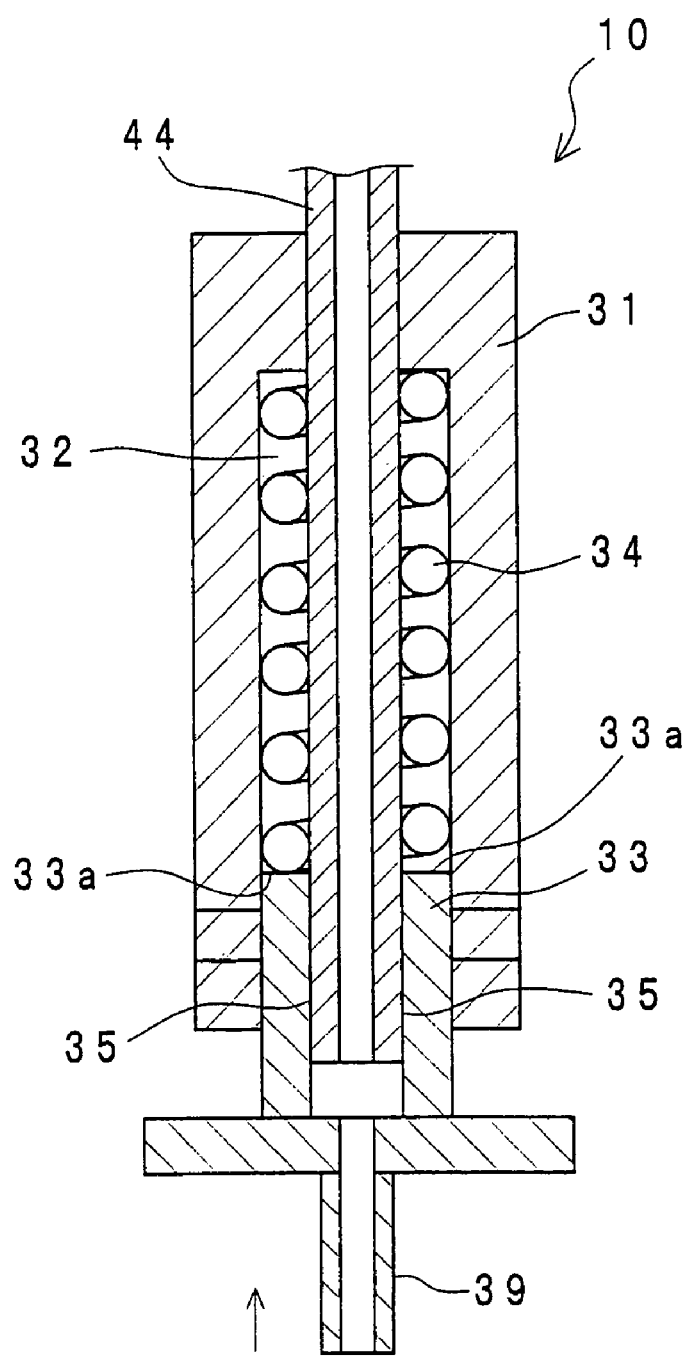
FIG. 4 is a partially expanded sectional view showing a constitution of a tip part of an adsorption nozzle assembly used in the first head part of FIG. 2.

FIG. 4 is a partially expanded view showing a constitution of a tip part of the adsorption nozzle assembly. As shown in FIG. 4, the tip part of the adsorption nozzle is provided with a nozzle part 39 for adsorbing and holding components, and is held by a holder 31 fixed to the tip part side of the spline shaft 44. The holder 31 is a hollow cylindrical member, and is fixed to the spline shaft, in a state that the spline shaft is pierced in the axial direction. In a hollow part 32 of the holder 31, a nozzle spring 34 is inserted in a periphery of the spline shaft 44 that extends inside the hollow part 32, and an insertion part 33 of the nozzle part 39 is inserted and is slidably held by guided by the spline shaft 44. Since an upper end 33a of the insertion part 33 is brought into contact with the nozzle spring 34, it is urged to a lower side by the nozzle spring 34. In addition, a stroke for escape as shown in an arrow is provided in the nozzle part 39, and when a stress is added downward to the nozzle part 39, the nozzle spring 34 is deformed, and the nozzle part 39 moves upward to prevent the held and mounted components from being added with an excessive stress.

Since air is sucked in the nozzle part 39 when holding the components as will be described later, dust in the circumference is also sucked in the nozzle part 39. Therefore, in the elapse of time, dust is accumulated in the nozzle part 39, which is then turned around to a sliding surface 35 of the insertion part 33 and the holder 31, resulting in poor sliding of the nozzle part 39 in some cases. When the poor sliding occurs, a sliding friction exceeds a spring force, to allow the nozzle to be in an escaped state upward. When this state occurs, a force to be added to the components is increased. Therefore, as will be described later, the component mounting apparatus according to this embodiment has a constitution for detecting this state by using the load cell 12.

Further, as shown in FIG. 2, the nozzle part 39 is in a state that a holding surface 11$a$, being its tip part, is exposed from a lower part frame 53$b$ which is the lower part of the outer cylinder 53. The lower part frame 53$b$ is provided with a detector composed of a light projector 60 and a light receiver 61 for detecting a position of the tip part of the nozzle part 39. A specific constitution of the detector will be explained later.

As shown in FIG. 2 and FIG. 3, each adsorption nozzle assembly 10 includes the spline shaft 44, the nozzle part 39 provided on the lower tip part of the spline shaft, driving shafts 45 coaxially integrally constituted with the spline shaft 44, and a timing pulley 41 for making the adsorption nozzle assembly 10 carry out θ rotations.

Figure 5:
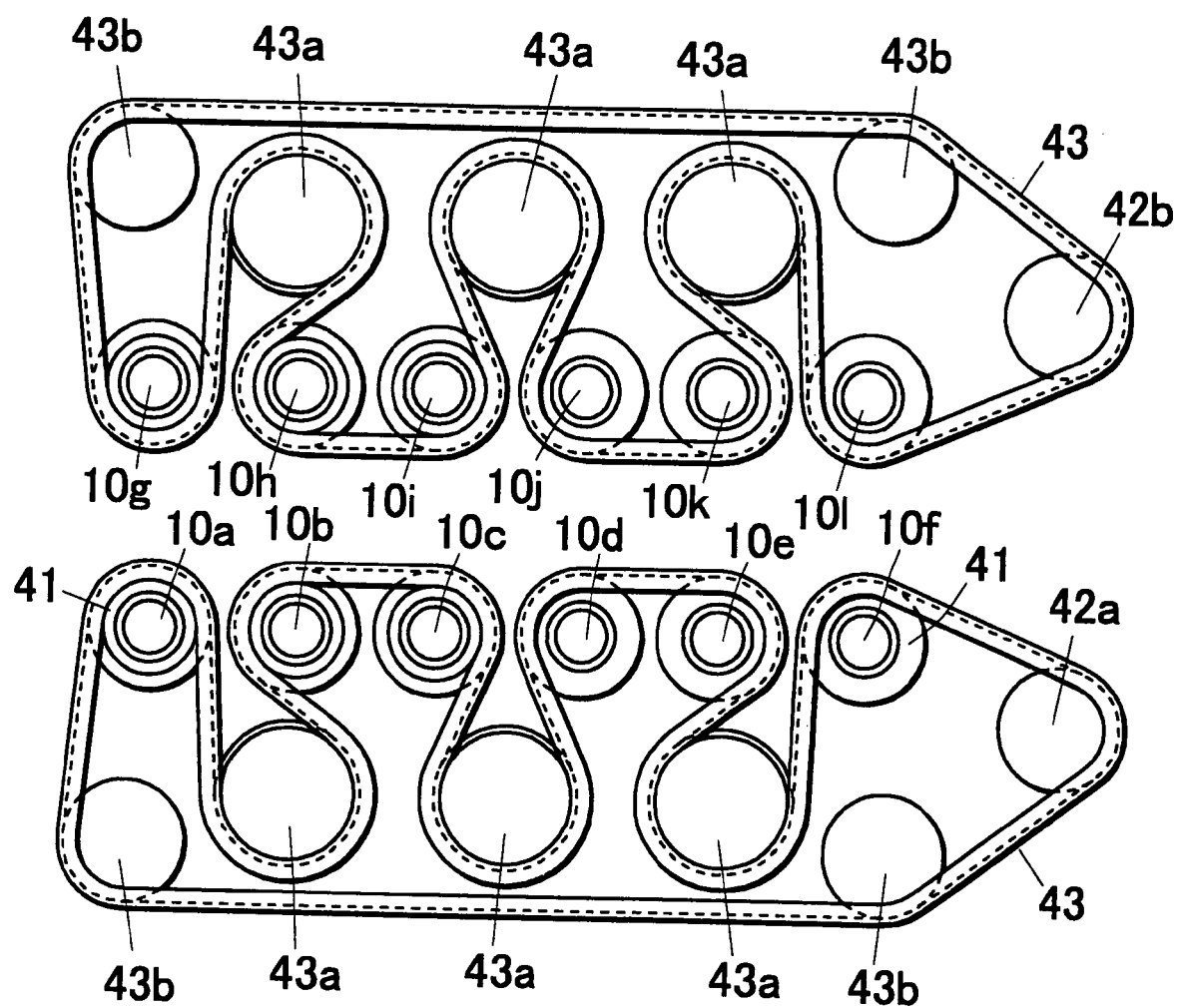
FIG. 5 is a view showing a θ rotation mechanism of the adsorption nozzle assembly of the first head part of FIG. 2.

The driving shafts 45 function as movable shafts of the actuator 40 for vertically moving the adsorption nozzle assembly 10, and are fixed by arranging a plurality of cylindrical permanent magnets formed with magnetic poles on both ends are arranged so that the both ends are opposed to each other. The timing pulleys 41 are connected to the spline shaft 44, both of which are relatively movable in the Z-axial direction, and a movement in a rotational direction, with the Z-axis as a center, is limited. As shown in FIG. 5, a timing belt 43 is engaged from the timing pulley 41 of the first adsorption nozzle assembly 10$a$ to the timing pulley 41 of the sixth adsorption nozzle assembly 10$f$. By an engagement of this timing belt 43, the first adsorption nozzle assembly 10$a$ to the sixth adsorption nozzle assembly 10$f$ can be simultaneously made to carry out θ rotations (rotation around an axis core of the adsorption nozzle assembly 10).

In addition, simultaneously, another timing belt is engaged from the timing pulley 41 of the seventh adsorption nozzle assembly 10$g$ to timing pulley 41 of the twelfth adsorption nozzle assembly 10$l$, and thus the seventh adsorption nozzle assembly 10$b$ to the twelfth adsorption nozzle assembly 10$l$ can be made to simultaneously carry out θ rotations.

Further, as shown in FIG. 3, each actuator 40 is constituted of a shaft-type liner motor, thus making it possible to vertically move the adsorption nozzle assembly 10 corresponding to this shaft-type linear motor, to selectively perform component adsorption holding or component mounting operations. Moreover, by detecting the magnetic pole of the permanent magnet provided in the nozzle assembly 10, this shaft-type linear motor can perform a vertical positional detection of the nozzle assembly. A specific constitution of the shaft-type linear motor and the positional detection of the nozzle assembly will be described later. Note that needless to say, in an ascending and descending mechanism of each adsorption nozzle assembly 10, it is possible to use a mechanism by a linear motor explained below, a mechanism by a ball screw shaft and a nut member, being a generally used mechanism, and a mechanism using an air cylinder, and in detecting a vertical directional position of this nozzle assembly, it is possible to use a publicly-known method by a linear guide, a linear scale, and a rotation angle control of the ball screw, etc., in addition to a method by an embodiment described below.

Next, the shaft-type linear motor as the actuator of the first head part 4 and the second head part 14 will be explained. The shaft-type linear motor includes the driving shafts 45 coaxially constituted with the spline shaft 44 of the adsorption nozzle assembly 10, and a stator 47 provided in a housing 46 of the first head part 4 and the second head part 14, and provided with a coil 48 and a position detecting magnetic pole sensor 49. In the driving shaft 45, a plurality of cylindrical magnets are arranged, with their S-poles/N-poles opposed to each other, and a suction hole for air is formed in a hollow part.

Figure 6:
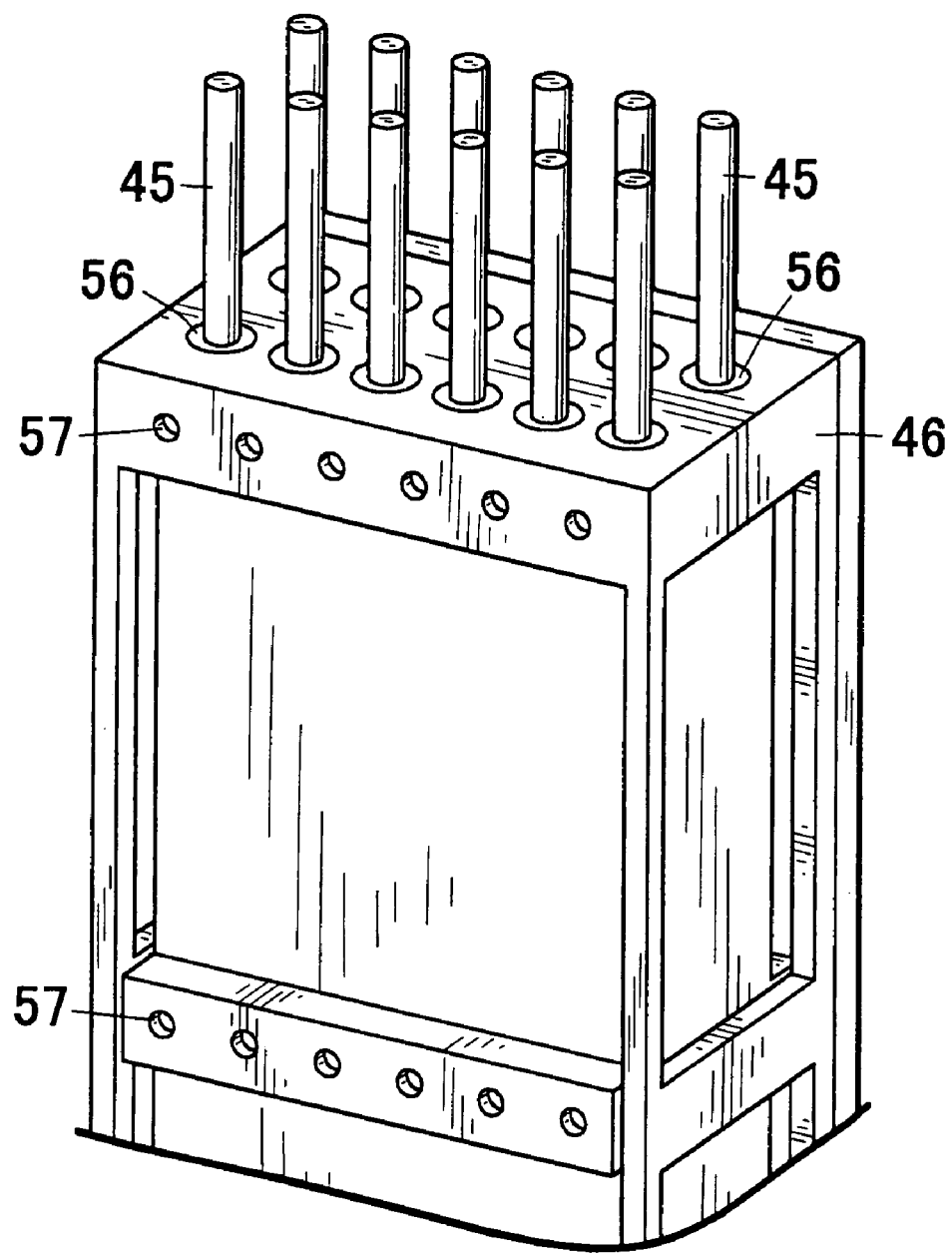
FIG. 6 is a partially expanded perspective view of the first head part of FIG. 2.

As shown in FIG. 6, the housing 46 has a shape of a hollow rectangular parallelepiped having a sufficient thickness against a mechanical strength, and is made of a non-magnetic material such as a plastic material.

The driving permanent magnet 45$a$ is a hollow cylindrical permanent magnet, each having the same length, and both ends in its axial direction become S-pole and N-pole. This driving permanent magnet 45$a$ is disposed in the driving shafts 45, so that the S-pole and the N-pole are opposed to each other.

In the stator 47, a plurality of coils provided with circular holes, the center of which allow the driving shafts 45 to be inserted, are laminated and disposed so that the holes are overlapped one another in the Z-axial direction, wherein the hole of each coil is formed as an insertion hole of the driving shaft 45. When the driving shaft 45 is received in a through hole, the coil 48 is positioned in the stator 47, so as to oppose to the permanent magnet 45$a$.

Below the bearings of laminated coils on the lower side of the figure, there are provided sensor units 49$a$ and 49$b$ constituted of two magnetic sensors 491 and 492 arranged in the axial direction (showing a case of a solid shaft in FIG. 7A and FIG. 7B). Each of the magnetic sensors 491 and 492 used in the two sensor units 49$a$ and 49$b$ detects a magnetic field of the driving permanent magnet 45$a$, by a position of the driving shaft 45. This embodiment uses a MR sensor (Magnetoresistance Sensor) composed of a permalloy alloy, wherein its electrical resistance is changed by a magnetoresistance effect when the magnetic field is added, and a constant current is run through this MR sensor. Accordingly, by running a current through the MR sensor and measuring a change of its voltage, the change of the magnetic field is detected, and the position of the driving shafts 45 relative to the stator can be detected.

Figure 7A:
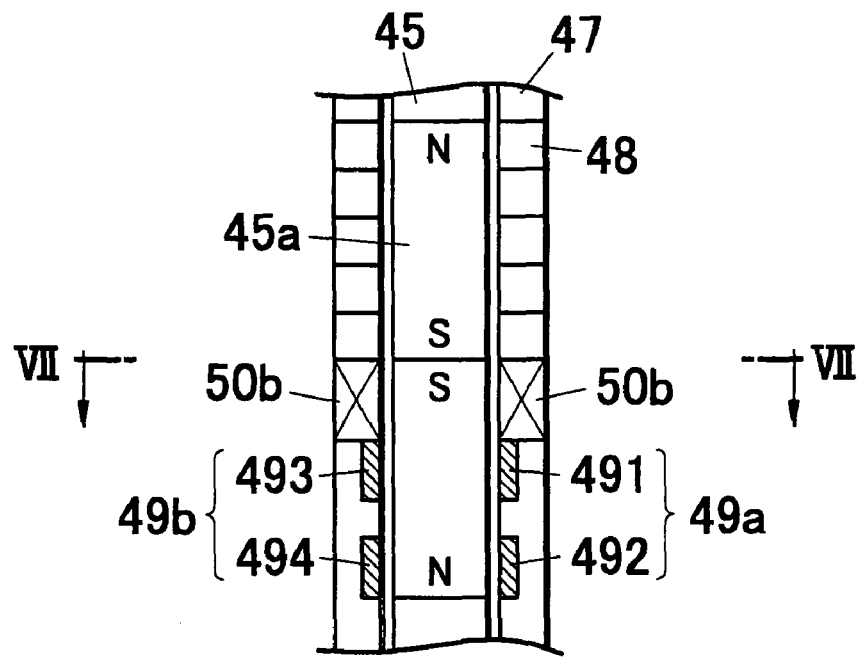
FIG. 7A is a partially expanded sectional view of an actuator of the first head part of FIG. 2.
Figure 7B:
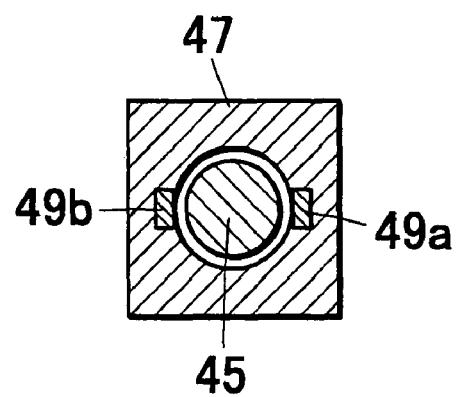
FIG. 7B is a sectional view taken along the line VII-VII of FIG. 7A.

As shown in FIG. 7A, the respective two magnetic pole sensors 491 and 492 whereby constituting the sensor units 49$a$ and 49$b$ are arranged at approximately a half interval of an axial directional dimension of the permanent magnet 45$a$ incorporated in the driving shaft 45. As a result, in a state of FIG. 7A, when the magnetic pole sensor 492, being one of the magnetic sensors, detects an approximately maximum magnetic field strength, the other magnetic detection sensor 491 can detect the magnetic field strength of approximately 0. The positional detection and its detecting method of the driving shaft 45 by the sensor units 49$a$ and 49$b$ will be explained later.

Each adsorption nozzle assembly 10 is constituted so as to be vertically moved in the Z-axial direction by the shaft-type linear motor 40, and is held in a state of being urged in an upper direction by a spring 52 in the figure, so that the adsorption nozzle assembly 10 is not descended by gravitation force. Note that a spring seat 55 for receiving the spring 52 is brought into contact with a lower end of the stator 47 when the driving shaft is at an original position, and functions as a stopper so as not to allow an upward movement of the driving shaft any more. With this structure, a method of detecting the original point of the driving shaft will be explained later.

Figure 8A:
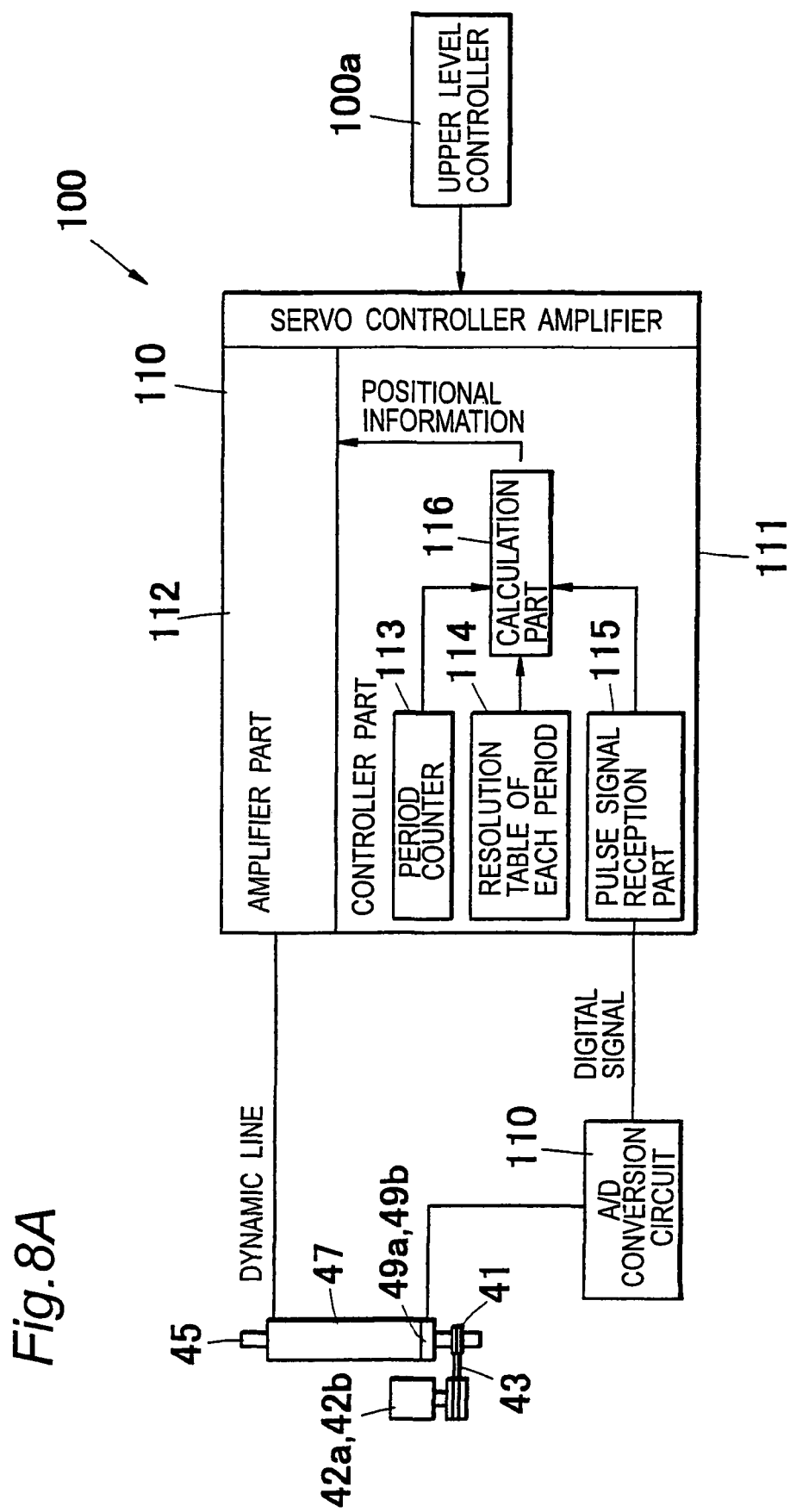
FIG. 8A is a block diagram of a control circuit for controlling to drive a shaft type linear motor used in the apparatus for mounting components as schematically shown in FIG. 1.

FIG. 8A is a block diagram of the control circuit for performing drive control and positional detection of a schematically shown shaft-type linear motor 40. As shown in FIG. 8A, a servo controller servo amplifier 110 for drive-controlling the shaft-type linear motor 40 constitutes a part of a mounting control device 100, and is constituted of an amplifier part 112 as an operation control part and a controller part 111 as a measurement control part. The amplifier part 112 receives an operation command signal inputted from an upper level controller 100a in a control calculation part 100 of the mounting apparatus 101, for example, and feeds electricity to the coil 48 of the stator 47 through a power line. The current runs through the coil 48 by a driving current outputted from the amplifier part 111 of the servo controller servo amplifier 110, and a repulsive force works between the coil 48 and the N-pole and the S-pole of the driving permanent magnet 45a, to move the driving shaft 45 in a prescribed Z-axial direction along the stator 47.

The controller part 111 of the servo controller servo amplifier 110 includes a period counter 113, a resolution table 114 of each period, a pulse signal reception part 115, and a calculation part 116. The period counter 113 counts a driving pulse of each period counter by dividing a magnetic field period as will be described later into a plurality of pulses (in this embodiment, 1000 for convenience of the explanation), to detect which position of the driving period the driving shaft 45 exists. The resolution table 114 of each period shows data for storing a length for each magnetic field period provided in the driving shaft, and as will be described later, is used in correction of the positional detection based on an assumption that the magnetic field period provided in the driving period is not completely the same period.

Along with a movement of the driving shaft 45 along the stator 47, the driving permanent magnet 45a provided in the driving shaft 45 passes over the magnetic pole sensors 491 and 492 of the sensor units 49a and 49b provided in the stator 47. As described before, the magnetic field period of the driving permanent magnets 45a is 8 mm, because the N-pole and the S-pole are formed for each length of 4 mm, when the length in the Z-axial direction is 4 mm, for example. With the movement of the driving shaft, a relative position of the magnetic pole sensors 491 and 492, and each permanent magnet is changed, and with the change of the relative position of them, resistance values of the magnetic poles 491 and 492 are changed.

Since a constant current runs through the magnetic pole sensors 491 and 492, when the driving permanent magnet 45a moves, a magnetic field strength signal is outputted from the magnetic pole sensors 491 and 492, respectively, in accordance with the magnetic field strength of the magnetic field period, which is then inputted in an A/D conversion circuit 110. The magnetic field strength signal outputted from each of the magnetic pole sensors 491 and 492 takes a locus of approximately a sine waveform in the same way as the magnetic field strength of the magnetic field period. The A/D conversion circuit 110 performs A/D conversion of this magnetic field strength signal, amplifies it, and inputs it in a pulse signal reception part 115. The pulse signal reception part 115 applies a waveform shaping to a continuously inputted digital signal and generates a prescribed digital signal, which is then outputted to the calculation part 116. Based on a value of the digital signal thus inputted and waveform thus shaped, the original point detection and the positional calculation of the driving shaft 45 are performed as described below.

Figure 8B:
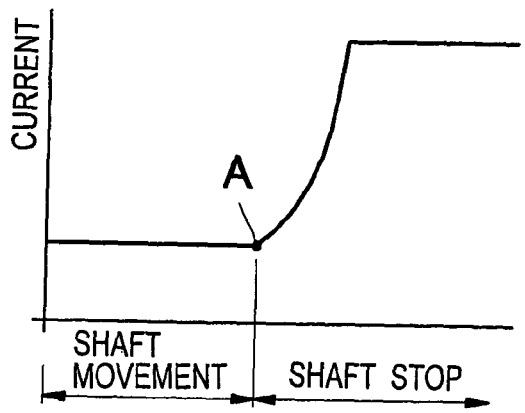
FIG. 8B is a graph showing a locus of a current value for detecting an original point of a driving shaft in the control circuit of FIG. 8A.
Figure 10A:
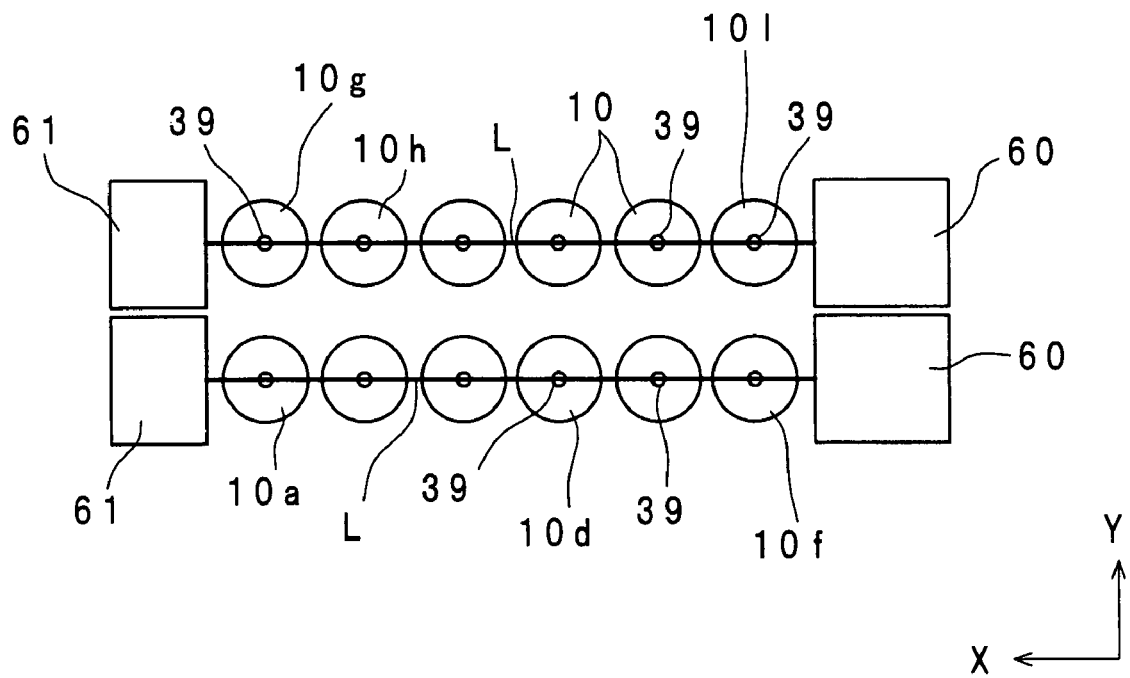
FIG. 10A is a substantial plan view showing a positional relation between a detector and a nozzle part.
Figure 10B:
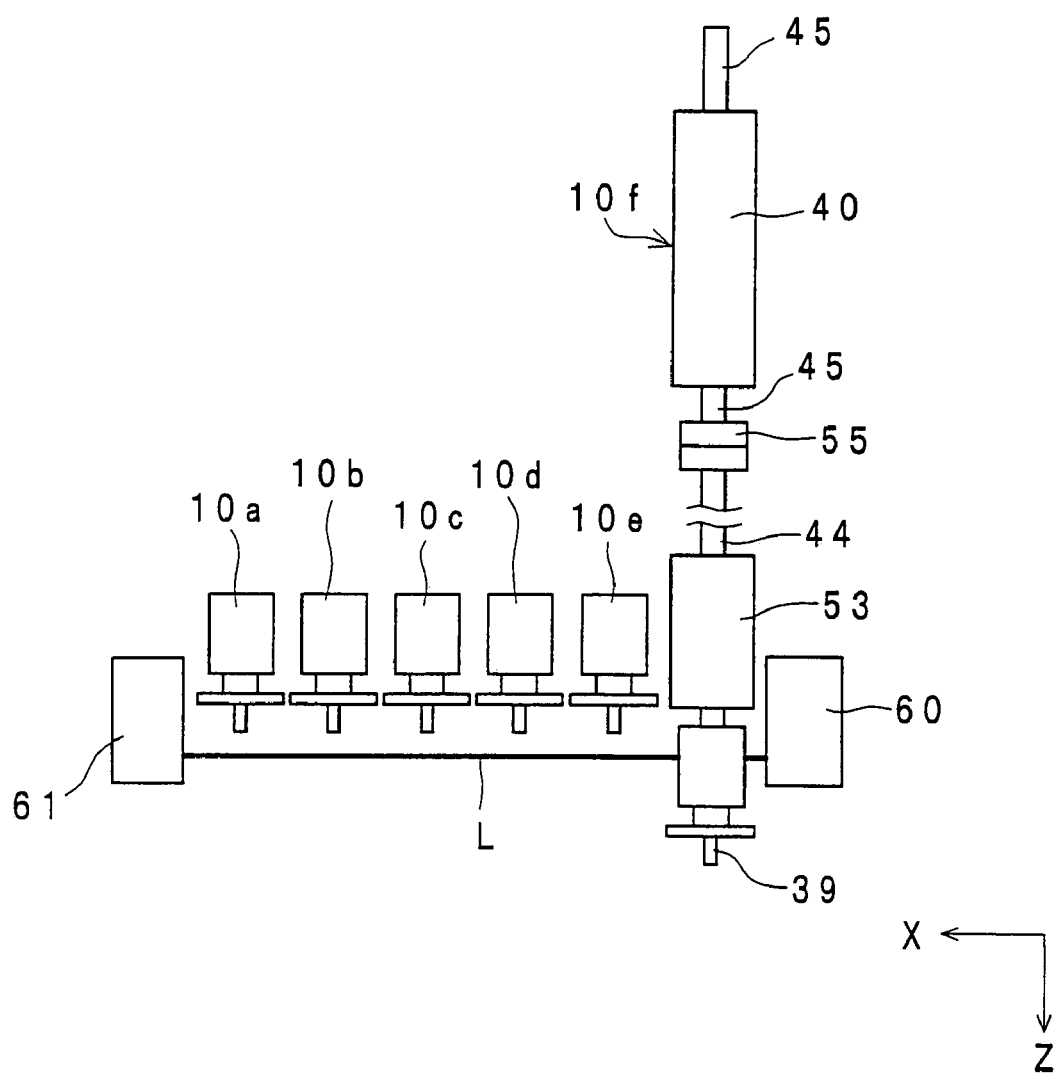
FIG. 10B is a substantial side view showing the positional relation between the detector and the nozzle part.

The method of detecting the original point will be explained below. In this embodiment, when the driving shaft 45 moves to the upper side and the spring seat 55 is brought into contact with the lower end of the stator 47, the original point detection is performed by using the change of the current value applied to the coil and detecting its current value. Namely, as shown in FIG. 10B, the driving shaft 45 moves to the upper side, and in the point A in the figure, the spring seat 55 is brought into contact with the lower end of the stator 47, and upward movement of the driving shaft 45 is impossible any more. At this time, as shown in FIG. 8B, the value of the current applied to the coil is increased, with the point A as a border so as to move a shaft, although it cannot move.

The servo controller servo amplifier 110 performs detecting the original point, based on the position of the driving shaft when this current value starts to increase and exceeds a threshold value, and with this position as a reference, performs the positional detection of the driving shaft as described below. Note that at this time, since the driving shaft 45 stops, an output value outputted from each magnetic pole sensor shows a constant value. Therefore, by adding this requirement to conditions of the original point detection, a stable detection is realized.

Figure 8C:
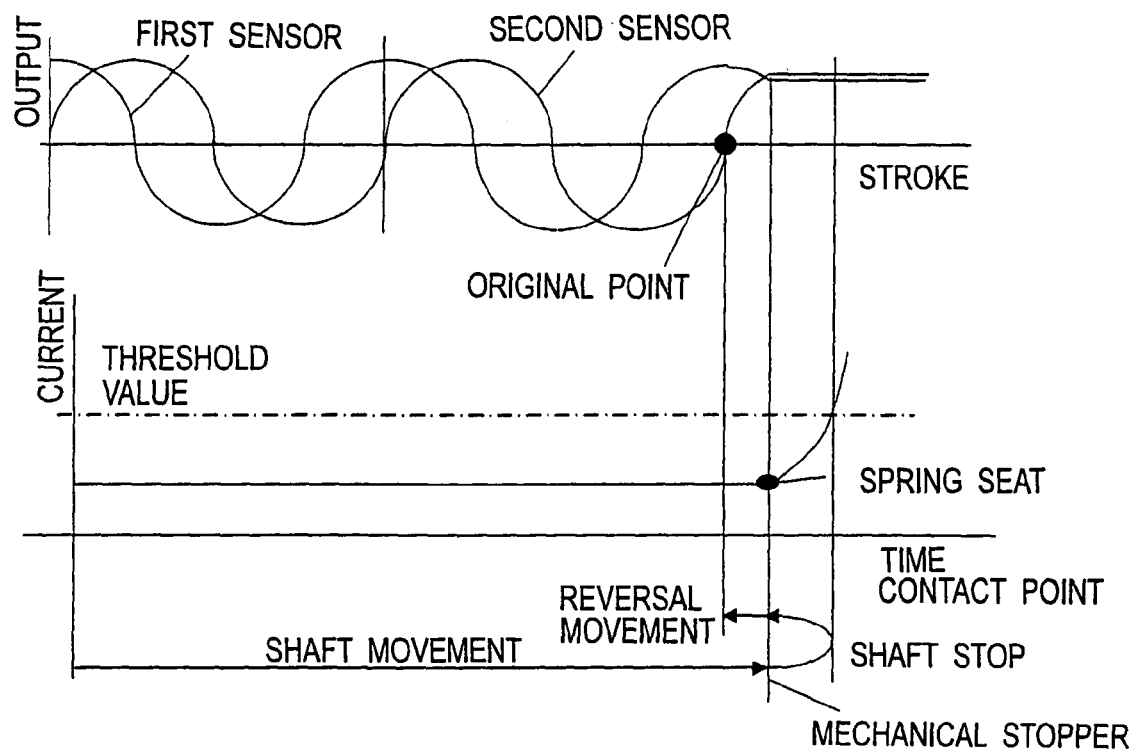
FIG. 8C is a view for explaining an example of processing of detecting the original point of the driving shaft in the control circuit of FIG. 8A.

In this embodiment, as shown in FIG. 8C, when the aforementioned driving shaft 45 moves upward, and the spring seat 55 is brought into contact with the lower end of the stator 47, thereby detecting so that the current value exceeds the threshold value and the outputs of the two magnetic pole sensors are not changed, the driving shaft 45 is controlled to descend from this position. Then, the position where the output of either one of the magnetic pole sensors 491 or 492 (in the figure, since two sensors is not required to be discriminated from each other, they are described as the first or second magnetic pole sensor) becomes firstly 0 is defined as the original point.

Figure 8D:
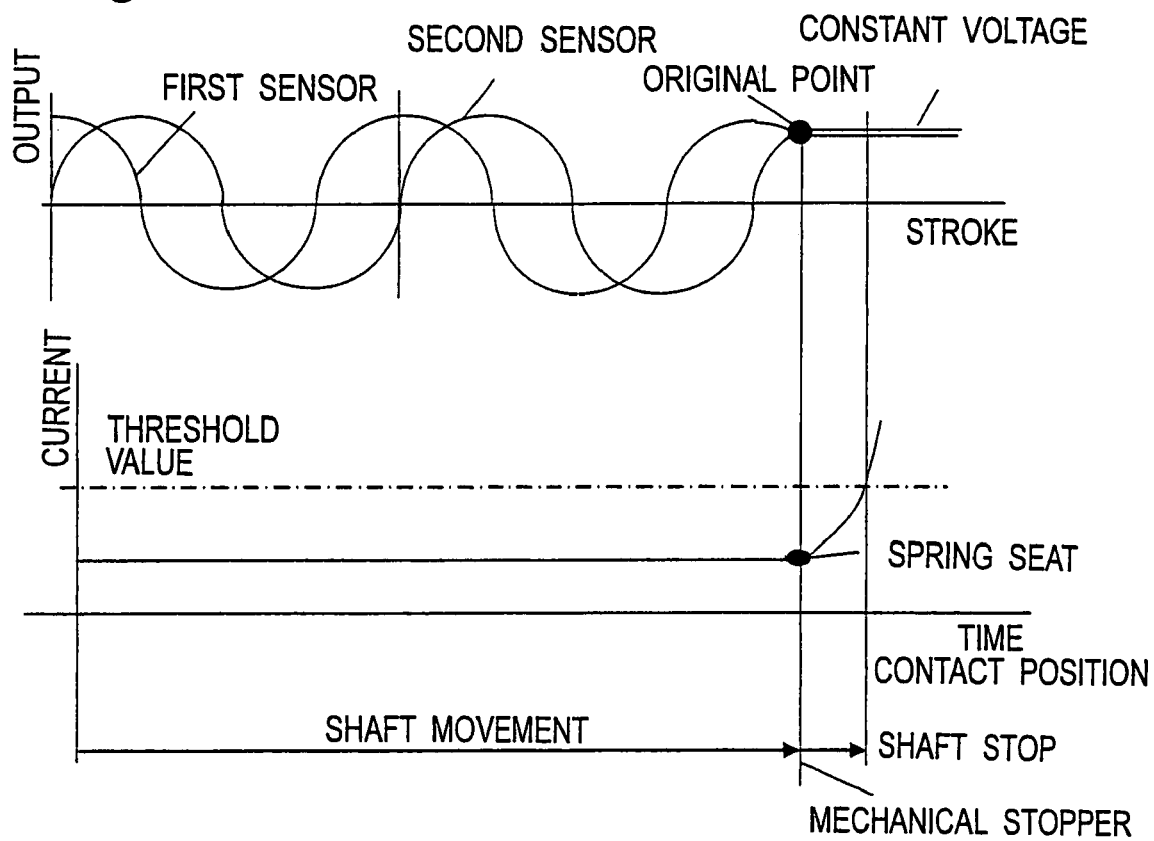
FIG. 8D is a view for explaining an example of other processing of detecting the original point of the driving shaft in the control circuit of FIG. 8A.

In addition, as shown in FIG. 8D, as another method of the original point position, the position where the driving shaft 45 moves upward and the spring seat 55 is brought into contact with the lower end of the stator 47, namely, the position where the driving shaft 45 exists when the value of the current applied to the coil starts to increase, may be the original point as it is.

Figure 9A:
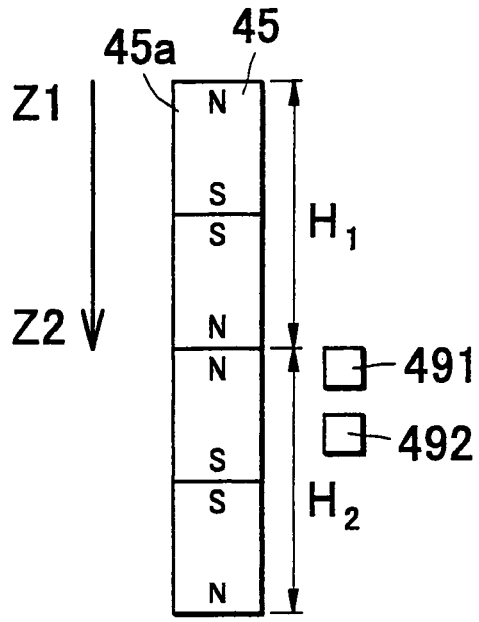
FIG. 9A is an explanatory view of a mechanism of detecting a position of the driving shaft.

Next, a specific detecting calculation example of the positional detection of the driving shaft 45 will be explained by using FIG. 9A. In FIG. 9A, when the length in the Z-axial direction of the driving permanent magnet 45a is assumed to be 4 mm, a distance H between N-poles is 8 mm. In FIG. 9A, when the driving shaft 45 is assumed to move on the lower side in the Z-axial direction, two magnetic pole sensors 491 and 492 output a signal, with a strength of the magnetic field as a voltage (in this embodiment, an output range is defined as a range of $-5V\sim+5V$), and its output signal is a magnetic field strength signal of approximately a sine waveform. Here, two magnetic pole sensors 491 and 492 are arranged at approximately a half interval of the length in the Z-axial direction of one driving permanent magnet 45a, namely, at an interval of 2 mm. Therefore, a phase of the sine waveform of an outputted magnetic field strength signal is deviated by $\pi/2$.

Here, when a measurement resolution of a voltage value (in the vertical axis in FIG. 9B) of the A/D conversion circuit 110 for converting the magnetic field strength signal outputted from the two magnetic pole sensors 491 and 492 into a digital value is assumed to be $\pm 500$, and a magnetic field period direction (in the horizontal axis in FIG. 9B) is assumed to be 1000, the resolution of a detection accuracy is obtained for each 8 mm/1000=8 μm.

Here, in FIG. 9B, explanation will be given to a case of the output from the two magnetic pole sensors 491 and 492. In order to detect the position of the driving shaft 45, the position of the driving shaft 45 is detected, with a moving distance from the original point is defined as a reference. Namely, as described above, the driving shaft is moved to the original point detected by detecting the current value applied to the coil, which is then moved in the lower side direction in the figure. At this time, a point of the same output value as the output value at the original points of the magnetic pole sensors 491 and 492 (in FIG. 9B, the position where the output of the sensor 491 is 0 and the output of the sensor 492 becomes maximum) is recognized as a detection point, and is defined as a first detection point, a second detection point . . . in an order closer to the original point. One magnetic field period is defined between the original point and each detection point.

The resolution table 114 of each period stores the information on the resolution at every pulse of each period in a period direction as shown in FIG. 9C. As described above, in this embodiment, since the resolution in a direction of the magnetic field period is 1000, one period, namely, the value obtained by dividing a total length dimension of two magnets by 1000 becomes the resolution of one pulse. In addition, the driving permanent magnet 45a incorporated in the driving shaft 45 is constituted to have a length in approximately the same Z-axial direction. However, variation in lengths sometimes occurs during processing, and this causes the variation in the magnetic field period. This variation is accumulatively added in proportion to a distance from the original point, and therefore the accuracy of the positional detection at a position far away from the original point is deteriorated. Therefore, in order to correct this variation of the period length, the information on the length of each period is stored in the resolution table 114, for each period of the magnetic field. FIG. 9C shows a case that a first period is set at period length of 8.1 mm, the resolution of one pulse is set at 8.1 μm, a second period is set at period length of 8.2 mm, and the resolution of one pulse is set at 8.2 μm.

Figure 9D:
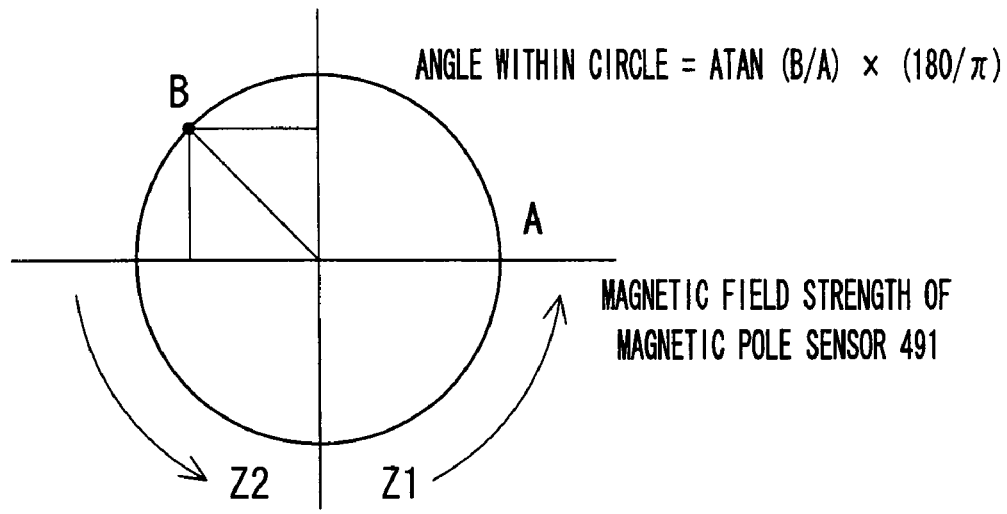
FIG. 9D is an explanatory view of an angle within a circle used for detecting the position of the driving shaft.

Here, when the output value of each of the magnetic pole sensors 491 and 492 is the output such as a point B in FIG. 9B (for example, the output of the magnetic pole sensor 491 is −2V, and the output of the magnetic pole sensor 492 is +2V), it is found that the point B is located at the second period, because it passes through the first detection point viewed from the original point. In addition, as shown in FIG. 9D, regarding the point B, an angle ATTN within a circle is (−2/2)×(180/π)=−45°, and the output of the magnetic pole sensor 491 is negative. Accordingly, from the waveform of the magnetic pole sensor, the point of Z1 is the position of 270°, and because of a counterclockwise rotation from the point, the detection position becomes the period length of the second period, 8.2 mm×(225°/360°=5.125 mm, meaning that it moves by 5.125 mm, with a start point of the second period, namely, the first detection point as a reference.

In addition, since the driving shaft 45 moves beyond one period, 8.1 mm of the first period length (namely, the length of two driving permanent magnets) is added to the distance, with the first detection point as a reference. Therefore, the magnetic pole sensor 491 outputs the magnetic field strength signal, with a moving distance from the original point set at 13.225 mm.

Note that the period length of the magnetic field added during calculating the moving distance may be calculated as the length of two driving permanent magnets, instead of previously storing it as table data as described above.

As described above, the first head part 4 and the second head part 14 guide the driving shaft 45 by the bearings 50a and 50b provided at upper and lower parts of the coil 38 so that its axis is coincident with a central axis of the coil 38. Therefore, the driving shaft 45 is constituted so as not to be deviated in the X-axial direction and the Y-axial direction in the stator 47. Accordingly, even when the adsorption nozzle assembly 10f is rotated around its axis by a motor 42a for θ rotations, the gap between the sensor unit and the driving permanent magnet 45a incorporated in the driving shaft 45 as described above is constituted to be approximately constant, and the moving distance of the driving shaft 45 can be detected by the sensor unit 49a having the two magnetic pole sensors 491 and 492 as described above.

Next, a mechanism for detecting the nozzle parts 39 provided on the tip part of the adsorption nozzle assembly 10 will be explained. FIG. 10A is approximately a plan view showing a positional relation between the detector and the nozzle part. FIG. 10B is a schematic side view showing the positional relation between the detector and the nozzle part 39b. In this embodiment, by detecting the fact that the tip part of the nozzle part 39 shields the light from the light projector 60 by the light receiver 61, the position of the nozzle part 39 is detected.

As shown in FIG. 10, two sets of light projector 60 and light receiver 61 are arranged along an arrangement direction of six adsorption nozzle assemblies arranged in the X-axial direction. Namely, the light projector 60 and the light receiver 61 on the lower side of FIG. 10A detect the adsorption nozzle assemblies 10a to 10f, and the light projector 60 and the light receiver 61 on the upper side of the figure detect the adsorption nozzle assemblies 10g to 10l. In addition, as shown in FIG. 10B, the light L emitted from the light projector 60 is shielded by an existence of any one of the six nozzle parts 39 (in FIG. 10B, the adsorption nozzle assembly 10f) on a light path to reach the light receiver 61, and the light can not reach the light receiver 61. Accordingly, the position of the nozzle part 39 in the Z-axial direction can be detected.

In this embodiment, a light emitter 60 uses a light emitting LED as a light source, and the light receiver 61 uses a CCD line sensor. The CCD line sensor is arranged so as to extend in the Z-axial direction, having the resolution of about 64 μm.

Figure 11:
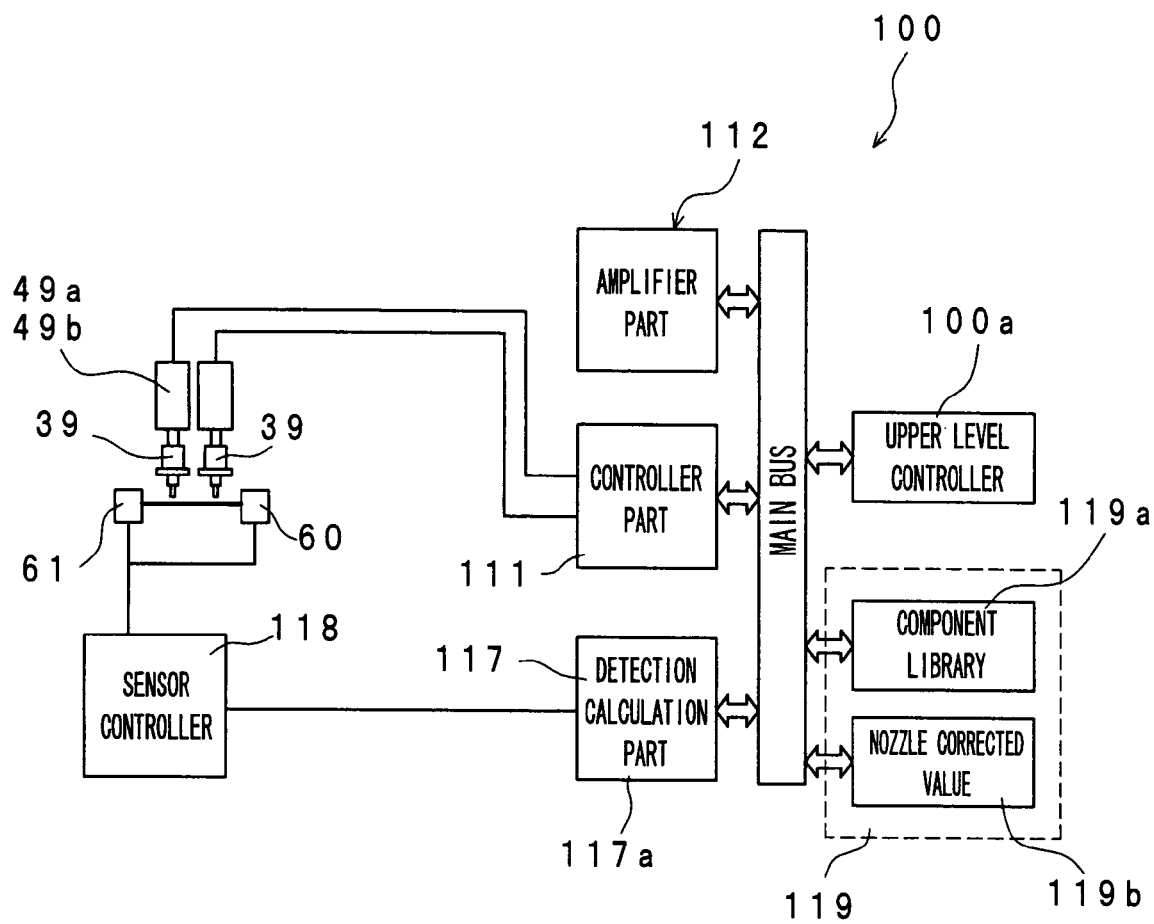
FIG. 11 is a block diagram of the control circuit for detecting a position of the nozzle part.

Next, the processing for the positional detection of the nozzle parts will be explained. FIG. 11 is a block diagram of the control circuit for performing the positional detection of the nozzle parts. The control circuit for performing the positional detection of the nozzle parts constitutes a part of the control circuit in the control calculation part 100, and includes a detection calculation part 117 for calculating the detection position, and a sensor controller 118 for controlling the light projector 60 and the light receiver 61 and processing and calculating a CCD output signal from the light receiver 61. In addition, the control circuit as shown in FIG. 11A is partially the same as the control circuit for controlling to drive the shaft-type liner motor as shown in FIG. 8A.

Figure 19:
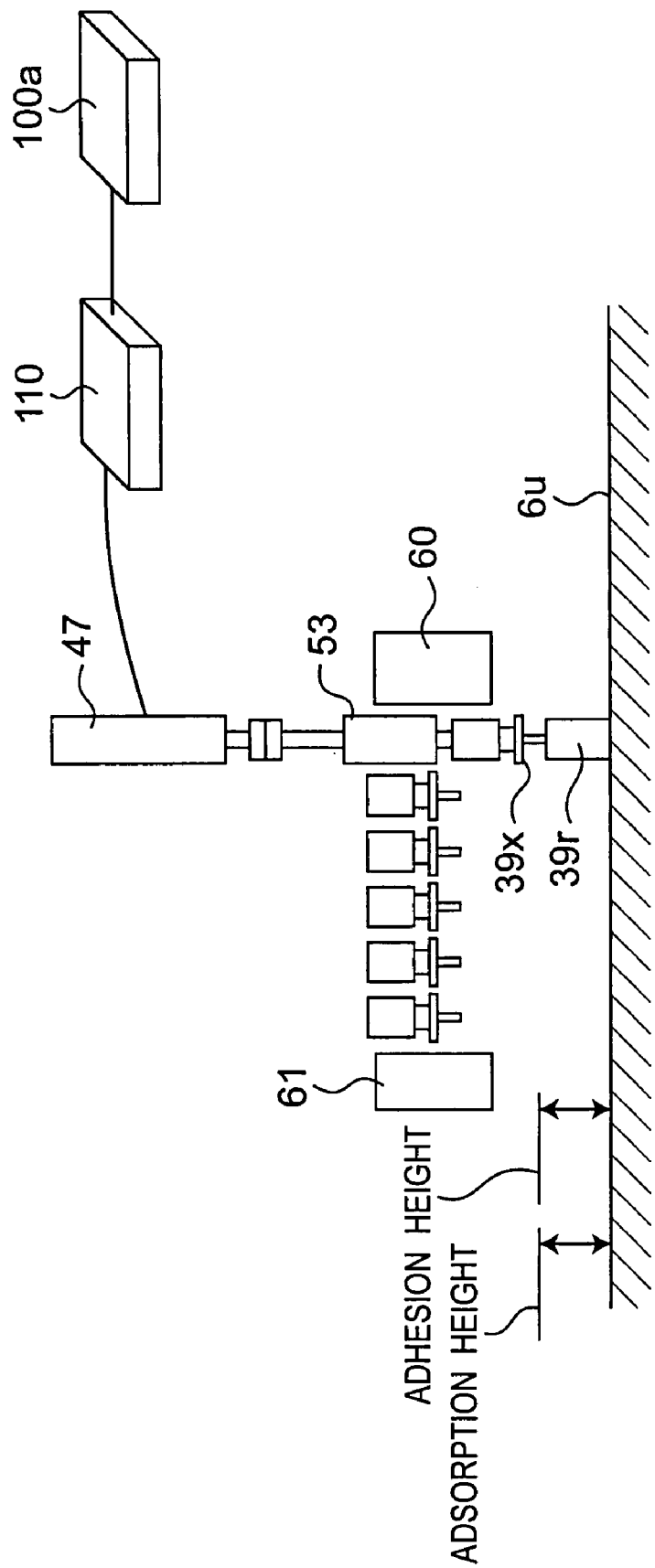
FIG. 19 is a view showing a sate of performing a height adjustment of the nozzle.

Note that the positional detection of the nozzle parts is performed on the assumption that all nozzles have the same heights. Therefore, it is requested that the nozzle parts have the same heights by the following procedure. FIG. 19 is an explanatory view of a height adjustment of the nozzles. In the adjustment of the heights of the nozzles, a jig nozzle 39x for adjusting and an inspection jig 39r for setting a height reference are used. The jig nozzle is a nozzle not having the escape in the upper/lower directions. First, the inspection jig 39r is set on an upper surface 16u of the mounting apparatus base stand 16 of the mounting apparatus 101, and the jig nozzle 39x is mounted on the nozzle part. In this mounting apparatus, an adsorption height, being a nozzle descending position when the components are adsorbed and taken out from the component supply part, and a mounting height, being a nozzle descending position when the components are mounted on the substrate are set at a determined position, with the upper surface 16u of the mounting apparatus base stand 16 as a reference. And therefore the position from the upper surface 16u needs to be detected.

As a detection operation, the jig nozzle 39x is pressed against the upper surface of the inspection jig 39r. The information on the height from a reference surface (namely, the height of the inspection jig) is allotted to an encoder value of the servo controller amplifier 110, which is the positional information on the nozzle height at this time, and the information thus allotted is stored in the upper level controller 100a. When the inspection of the positional information regarding one nozzle is finished, such inspection is similarly performed to all the nozzles. By the above-described processes, the encoder value of each actuator at a common reference height is obtained for all the nozzles, and based on this information, the nozzle can be positioned at an arbitrary position from the reference surface as shown below.

Next, the positional detection of the nozzle part will be explained. In this embodiment, the positional detection of the nozzle part is performed by the output value from the CCD line sensor of the light receiver 61. Namely, since the output value of the CCD line sensor is different depending on an area of shielding the CCD line sensor by the nozzle part 39, the position of the nozzle part 39 is detected by detecting this output value. However, the distance from the light emitter 61 to the nozzle part 39 in the X-axial direction is different. Therefore, by diffusion of the light L, even if the nozzle part 39 is positioned in the same Z-axial direction by the X-axial directional position of the nozzle, the output value from the CCD line sensor is different. In order to solve this problem, a nozzle corrected value 119b showing a relation between the output of the CCD line sensor for each nozzle part and a Z-axial position of the nozzle is stored in a storage part 119, and the position of the nozzle is detected by the information on this nozzle corrected value 119b.

Figure 12A:
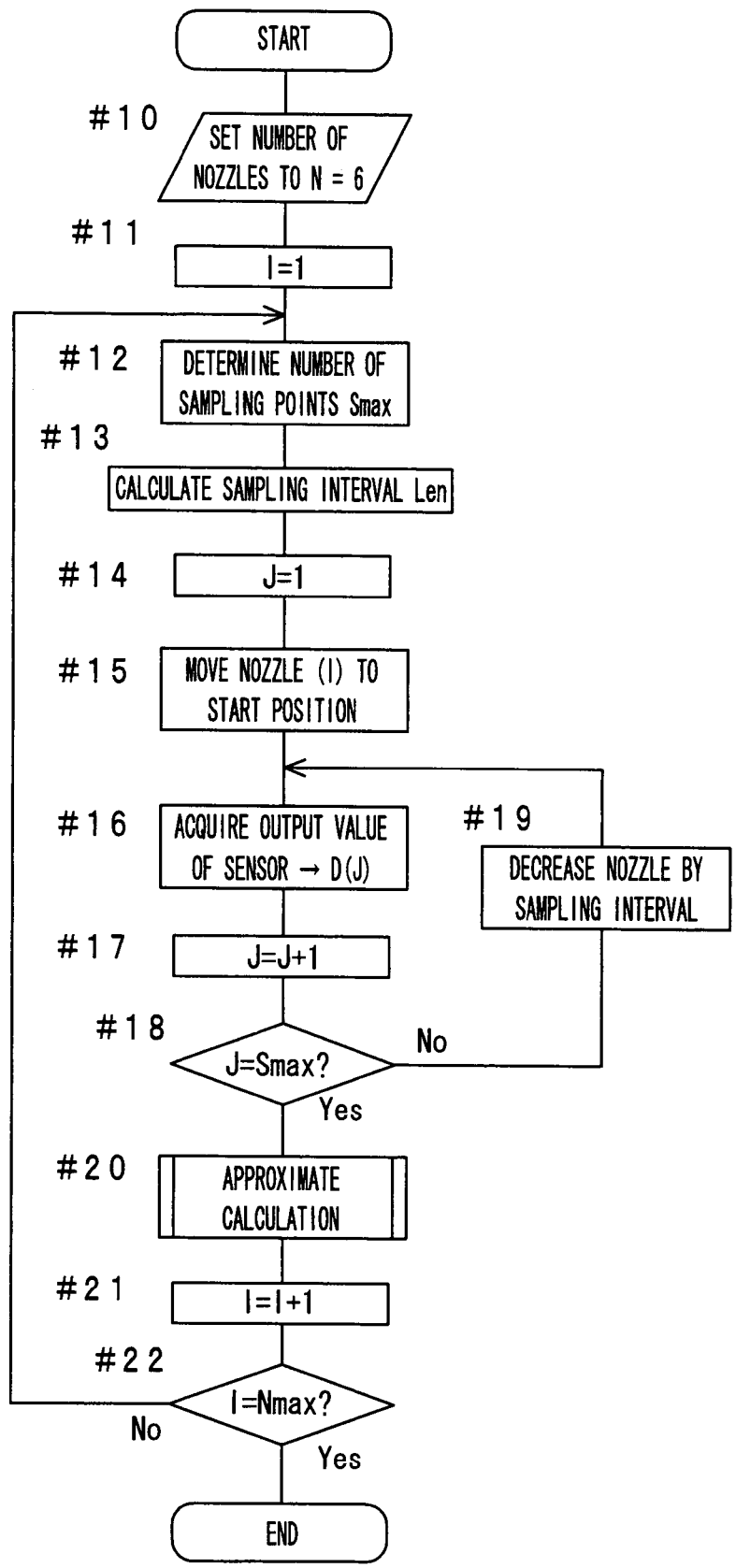
FIG. 12A is a flowchart showing a flow of processing for determining a nozzle corrected value for detecting a position of a nozzle.

FIG. 12A is a flowchart showing a flow of the processing for determining the nozzle corrected value for the positional detection of the nozzle. First, the number N of the nozzles detected by one CCD line sensor is set (#10). In this embodiment, since the positional detection of six nozzle parts is performed by one light projector 60 and light receiver 61 as described above, and therefore 6 is set as N.

Subsequently, setting of the corrected value of the first nozzle is started (#11). First, a sampling point Smax is set for each nozzle (#12). The number of the sampling points Smax is the number of the reference positions of the output values of the CCD line sensor in a detection area of the CCD line sensor, and can be set flexibly by the width of the detection area and a CCD resolution. However, in order to obtain a gradient of an analytical curve as shown below and an approximation accuracy of a segment with high accuracy, the number of the sampling points is preferably about five. In this embodiment, explanation continues on the assumption that the number of the sampling points is about five.

Figure 12B:
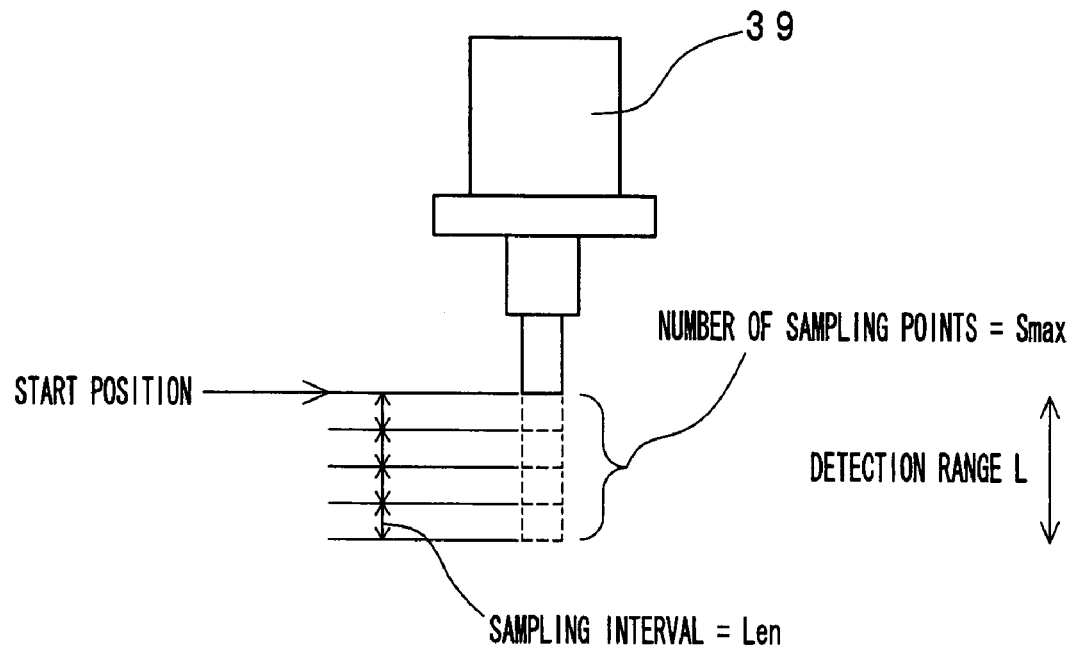
FIG. 12B is a view explaining a calculation of sampling intervals.

After the number Smax of the sampling points is determined, as shown in FIG. 12B, a sampling interval Len is calculated by dividing the detection area of the CCD line sensor by the number Smax of the sampling points (#13). Next, the detection at a first sampling point for a first nozzle part 39 is started (#14).

Specifically, the first nozzle (here, setting of the corrected value of the position of the nozzle parts of the adsorption nozzle assemblies 10a to 10f is performed, and this is performed in an order from the adsorption nozzle assembly 10a) is moved to a start position (#15). This position is set as the position on the lower side of the original point of the aforementioned driving shaft 45 by a prescribe distance. Namely, the tip part position of the nozzle part 39 is determined by the position of the driving shaft 45, and the start position of the nozzle part 39 can be set. Therefore, when the size of the nozzle part is different from each other, the position of the driving shaft 45, with its tip part at the start position, is different.

An output value D of the CCD line sensor of the light receiver 61, with the nozzle part 39 at the start position, is detected by a sensor controller 118 (#16). This output value D (1) is transmitted to the detection calculation part 117 from the sensor controller 118, and is temporarily stored.

Next, the sampling point to be detected is incremented by one (#17), and a sensor output D (2) at the second sampling point is detected. Such a processing from #16 to #19 is repeated, and all of the sampling points are detected. Note that at this time, whether or not the detected sampling point is the maximum value of the sampling points is determined (#18), and when the next sampling point to be detected exists, the driving shaft 45 is moved downward by a sampling interval to lower the nozzle parts 39 (#19). After the sensor output values D(1) to D(5) for all of the sampling points, are obtained, the detection calculation part performs an approximate calculation (#20).

Figure 13:
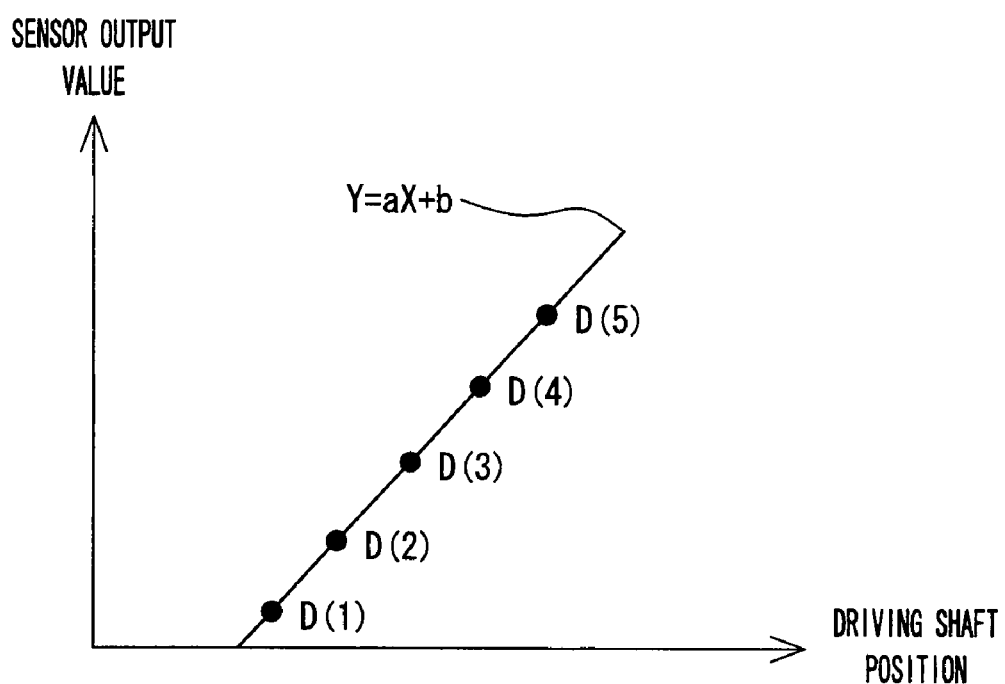
FIG. 13 is a graph showing a relation between the position of the driving shaft and an output value of a CCD sensor used in an approximate calculation.

As shown in FIG. 13, as the approximate calculation, a primary approximation is performed, so as to be approximated to the sensor output values D(1) to D(5) for all the sampling points obtained as described above. Namely, when the X-axis is defined as the position of the driving shaft 45, and the Y-axis is defined as the output value of the CCD sensor, the gradient (a) of the analytical curve (Y=a X+b) and a segment (b) are calculated by the primary approximation from the sensor output values D(1) to D(5), and the information on a formula of linear function is obtained. At this time, the height position where the sensor output is a prescribed value is set as a sensor original point. Note that in this embodiment, the reason why the analytical curve is defined as the primary approximation is that when the light from the light emitter 60 is parallel and a fitting angle of the CCD line sensor is vertical to an incident direction of the light, a ratio of the moving distance of the nozzle parts 39 and the output value of the sensor is 1:1, while when the light source is not parallel or the fitting angle is not vertical, a proportional relation becomes 1:a. However, when affected by an aberration of a lens provided in the light emitter 60 or the light receiver 61, the proportional relation is not obtained, and therefore a second order and the third order approximations are possible. Note that an approximate processing can be omitted, by measuring a sensor output at all sampling points at a sampling interval of accuracy (CCD resolution) as the output of the CCD line sensor.

After such a processing is repeated, the second nozzle (the nozzle part 39 or the adsorption nozzle assembly 10b) is measured (#21), and when all of the nozzles are measured (Yes in #22), the information on the formula of the analytical curve for each nozzle is stored so as to correspond to the adsorption nozzle assembly 10, as the information on the nozzle corrected value 119b for each nozzle.

The information on the nozzle corrected value 119b thus obtained is used in a case of detecting various conditions of the nozzle part, when automated operation of the component mounting apparatus of this embodiment is performed. Specifically, (1) by always measuring the height of the nozzle part during automated operation, feed back of the information on the height of the nozzle part is possible at the time of adsorbing and mounting. (2) poor nozzle height (for example, in a case of a bent tip part of the nozzle) can be determined. (3) poor escapable sliding of the nozzle part upward is determined. (4) a holding posture of the components (determination how the adsorbed components are held) can be detected. (5) bringing back of the components during mounting can be determined.

Figure 14:
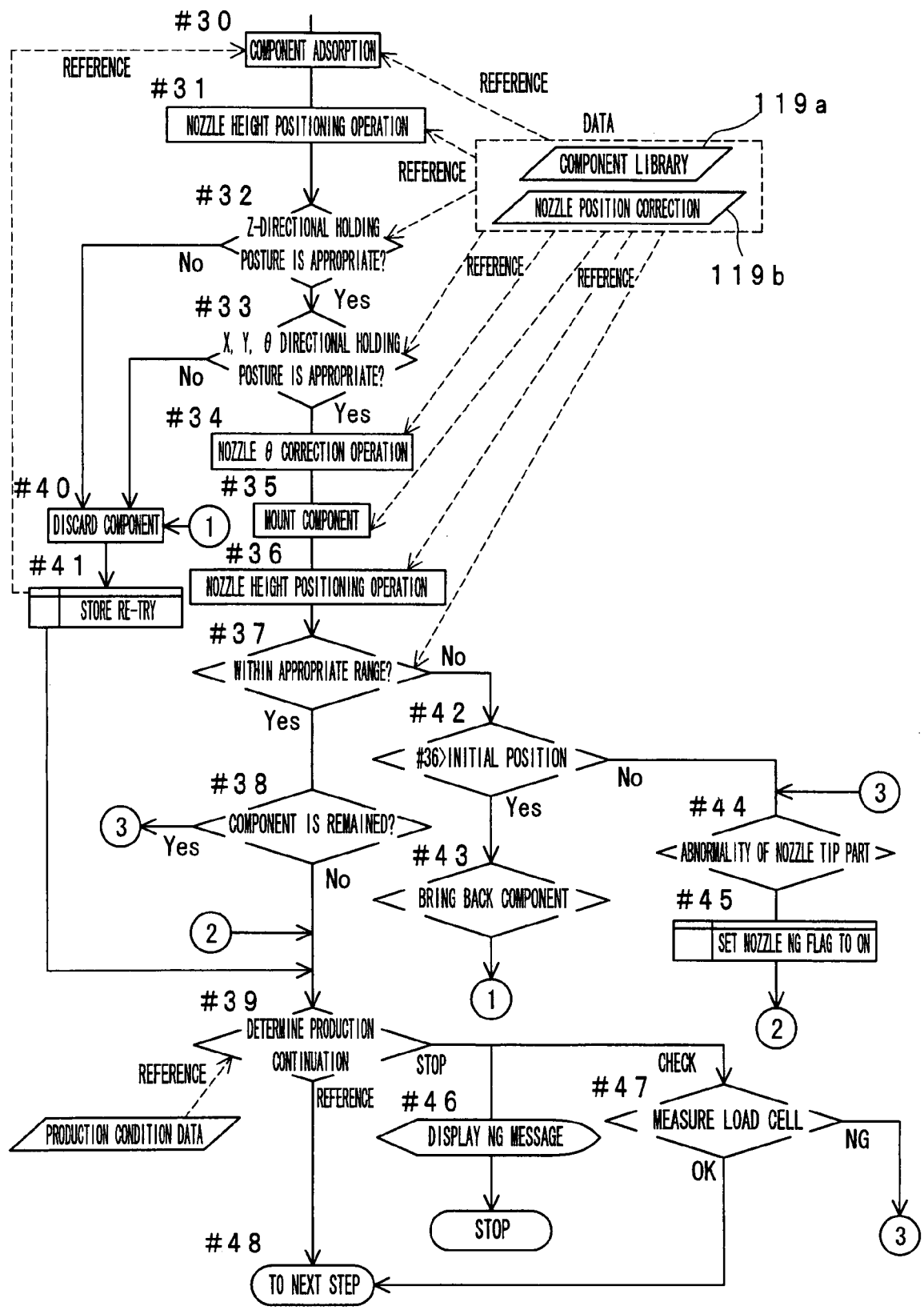
FIG. 14 is a flowchart of an adsorption/mounting operation during an automated operation of the apparatus for mounting components according to this embodiment.

How to make these determinations will be explained hereunder. FIG. 14 is a flowchart of an adsorption/mounting operation of the component mounting apparatus of this embodiment during automated operation. In this flowchart, the processing of adsorption/mounting of the components is explained, on the assumption that a component library 119a as the information on a size such as thickness of the component is stored in the storage part 119, and the information on the nozzle corrected value 119b for the nozzle fitted to the adsorption nozzle assembly 10 is already known.

In the component mounting apparatus according to this embodiment, the position in the Z-axial direction where the not-driven nozzle stands-by during automated operation is high enough not to shield the light projector 60 and the light receiver 61.

FIG. 20 shows a timing chart regarding a vertical drive of the nozzle, the height of the nozzle, and an ascending and descending speed of the nozzle of the mounting apparatus.

In the mounting step of the component mounting apparatus of this embodiment, as shown in FIG. 20, first, the adsorption of the components is performed (#30). The adsorption of the components is performed in such a way that the nozzle part 39 of the adsorption nozzle assembly 10 specified to adsorb the components is moved upward of the components to be mounted, in the X-axial and Y-axial directions, thereafter the nozzle part 39 is descended in the Z-axial direction by a prescribed width by driving the linear motor, and the components are sucked from the nozzle part 39 and held. A descending distance of the nozzle part 39 for adsorbing the components is a total distance of a height Hg from a stand-by position of the nozzle to a component supply part non-interference range Hf and a component adsorption surface. Here, in the component supply part non-interference range, the nozzle descends to a component supply height (the same height as the height of the mounting surface) of the component supply part, when the nozzle descends to the component supply part to take out the components. On the component supply part, the component supply part non-interference range Hf means a limit height where the nozzle has nothing to hit against, even if the nozzle is moved in the XY directions on the component supply part, when the nozzle is previously descended to the component supply part non-interference range Hf.

When the nozzle part 39 passes through the detection range Hc, in the intermediate point of a descent of the nozzle par 39, the nozzle part 39 shields the light from the light projector, and the output value of the CCD line sensor measures the position of the driving shaft 45 at a timing when the output value of the CCD line sensor becomes the output value at the original point of the nozzle corrected value 119b determined as described above. The nozzle part 39 is descended to the component holding position by a prescribed width Hg, with the position of the driving shaft 45 thus measured as a reference. Detection and control of a moving amount of a descent width of the nozzle part 39 at this time are performed by the positional detection of the driving shaft 45 by the aforementioned magnetic pole sensor 49 for positional detection. Namely, since the original point at the tip part of the nozzle is already known by the aforementioned nozzle corrected value 119b, the nozzle part 39 is descended by the distance between components calculated from the distance from the original point based on the position of the driving shaft 45.

Figure 15:
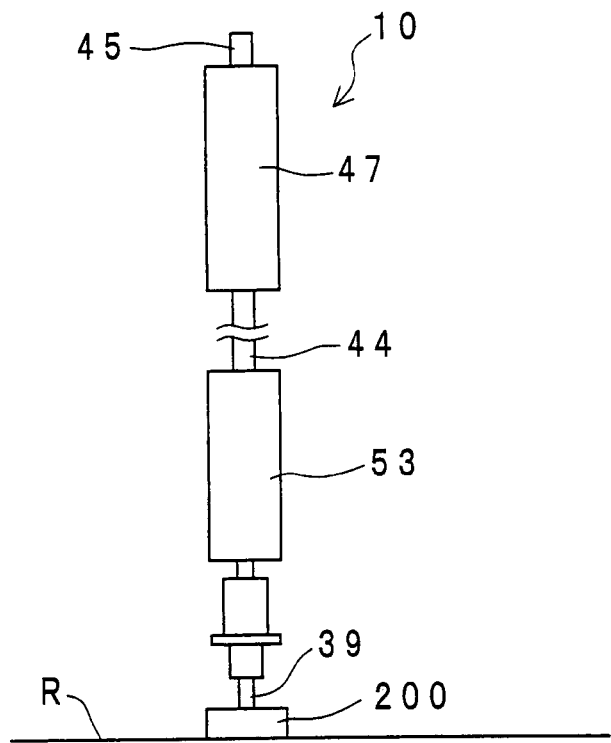
FIG. 15 is a schematic view showing a moving position of the driving shaft in a positioning operation of a nozzle height.

Next, a nozzle height positioning operation is performed (#31). As shown in FIG. 15, the nozzle height positioning operation is performed in such a way that a height position of the driving shaft 45 is controlled, with reference to the nozzle corrected value 119b, so that the lower end of a component 200 adsorbed to the nozzle is coincident with a sensor measurement original point R, and the position of this driving shaft 45 is calculated. Specifically, the position of the driving shaft 45 is measured at a timing when the nozzle part, whereby the components are adsorbed and held, is moved upward to a stand-by position once, then from this position, the nozzle is descended one by one, and the output value of the CCD line sensor becomes the output value at the original point of the nozzle corrected value 119b.

Figure 16:
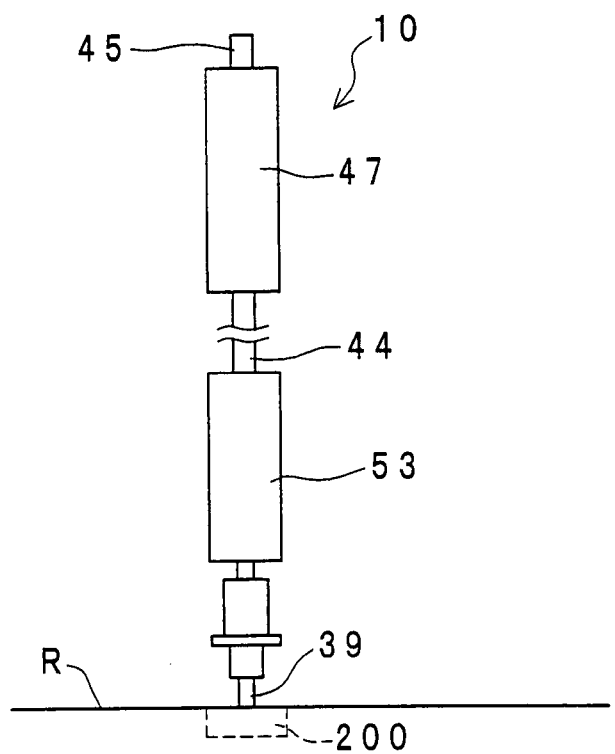
FIG. 16 is a schematic view showing a position of the original point of the driving shaft when components are not held.

When a nozzle height correction (#31) is completed, subsequently, whether or not a height detection processing of the components, namely, an adsorption and holding posture of the components in the Z-axial direction is appropriate is determined. Namely, the information on a thickness dimension of the components adsorbed to the nozzle is read by the component library 119a, and a difference between the height position of the driving shaft 45 in correcting the nozzle height and the height position at the nozzle original point is compared, and if this difference is a prescribed value or more, it is so determined that the nozzle part 39 does not adsorb and hold the components in an appropriate direction. Namely, as shown in FIG. 16, when the nozzle part adsorbs and holds the components appropriately, the height position of the driving shaft 45 measured by the nozzle height positioning operation is moved upward by a thickness dimension of the component 200, compared to a case that the tip part of the nozzle part 39 is coincident with the sensor measurement original point R. Accordingly, by measuring the height dimension of the driving shaft 45 measured by the nozzle height positioning operation, a holding condition of the components adsorbed to the nozzle can be determined.

Specifically, when the thickness of the adsorption component 200 is measured, thickness data thus measured is sent to the upper level controller 100a. Meanwhile, simultaneously, component numbers of the adsorbed components are read from a controller (not shown) of the component mounting apparatus main body, the upper level controller 100a reads a standard data of the thickness corresponding to each component, with reference to the previously stored component library 119a. The data of the two thicknesses are compared by the upper level controller 100a, and when the component thickness thus measured is a prescribed value or more previously defined by the components, a determination result of poor adsorption is outputted.

When the adsorption holding is determined to be appropriate (Yes in #32), the first head part 4 moves the nozzles, whereby the component 200 is adsorbed, to an imaging position of a recognition camera 9, images the adsorption posture of the components, and determines whether or not the adsorption holding posture in a XYθ directions is appropriate (#33). Namely, in this embodiment, the light projector 60 and the light receiver can measure only the thickness dimension of the components (namely in the Z-axial direction) to perform detection in the X-axial direction, and cannot detect an adsorption deviation of the components in the X, Y, and θ directions. Therefore, in order to mount the components on an appropriate position by the recognition camera 9, the holding position and θ rotations are detected. In this determination also, with reference to the component library 119a, the X and Y direction dimensions and θ rotation angle are detected, and when they exceed a previously defined allowable range, a determination result of poor adsorption is outputted.

Note that when the adsorption holding posture (#32) of the components in the Z-axial direction and the adsorption holding posture (#33) in the XYθ directions are determined to be not appropriate, the component adsorbed to this nozzle is discarded (#40).

Note that out of the nozzle parts 39 provided in the head part 4, when there are a plurality of nozzle parts 39 for adsorbing and holding the components in this step, the aforementioned processing is repeated, and the components are appropriately adsorbed and held to all predetermined nozzles. Then, when the adsorption and holding of the components 20 for all nozzle parts 39 are determined to be appropriate in all directions of XYZθ, the mounting of this component 200 is started (#35). At this time, when a mounting direction of the components is changed as needed, the adsorption nozzle assembly 10 is made to carry out θ rotations before being mounted (#34).

In mounting the components (#35), the head part 4 is moved to a predetermined position in the XY directions by a XY robot 5, and while correcting a mounting height up to a substrate 2 and a XY mounting coordinate positions, the component 200 adsorbed and held by the tip part of the nozzle part 39 is mounted on a predetermined position of the substrate.

When mounting of the components is finished, the nozzle height positioning operation is performed again (#36). Namely, during a movement of the nozzle part from a descent state to a stand-by position for mounting the components on the substrate, at a timing when the lower end of the nozzle part 39 (the lower end of the component 200 when the components are brought back due to a mounting error as will be described later) is coincident with the sensor measurement original point R, the height position of the driving shaft 45 is measured, and the position of this driving shaft 45 is calculated.

Next, the position of the driving shaft 45 thus measured in step #36 and the position of the driving shaft when the mounting is started are compared to detect the height (#37), and whether or not the tip part of the nozzle part 39 is at an appropriate position is determined. Namely, whether or not the difference between the position of the driving shaft 45 measured in step #36 and the position of the driving shaft at a mounting start time is within an appropriate range is determined.

When this difference is within the appropriate range (Yes in #37), the first head part 4 moves the nozzle, to which the component 200 is adsorbed, to the imaging position of the recognition camera 9, and images the nozzle part 39, and determines whether or not the components are held by the nozzle part 39 (#38). Namely, when bringing back of the component 200 due to the mounting error and a nozzle ascent (for example caused by poor sliding) are simultaneously occurs, there is a possibility of determining it to be within the appropriate range in #37, even if the components are brought back. Therefore, by imaging the nozzle part 39 from downside, whether or not the components are held by the nozzle is confirmed. When it is so determined that the components are not remained (No in #38), a determination of production continuation is successively performed (#39).

By the determination of production continuation, whether or not a production is continued or stopped is determined, with reference to production condition data. The production condition data is stored in the storage part of the component mounting apparatus according to this embodiment, and production conditions as described below are stored. Specifically, when a nozzle tip part abnormality (#44) is detected, it is determined whether or not a facility is stopped, or whether or not the production is continued by the adsorption nozzle assembly 10 excluding the adsorption nozzle assembly 10 having a poor nozzle, and when the components are adsorbed in a state of a poor component holding posture, it is determined how many times are required for determining the nozzle to be poor. In the processing of the determination of production continuation, when it is so determined that the production should be continued, the processing is moved to the operation of the next component mounting (#48).

Next, when poor adsorption/mounting flow of the components is determined, this case will be individually explained.

First, in FIG. 14, when it is so determined that the holding posture in the Z-axial direction and XYθ directions are not appropriate (No in #32 and #33), the component 200 adsorbed to the nozzle part 39 is discarded (#40). Subsequently, re-try storing process is performed (#41). Namely, the condition that the nozzle parts 39 cannot hold the components in an appropriate posture is added to the production condition data, for reference in the determination of production continuation. When this storing process is finished, a production condition is determined (#39), and the processing is moved to the next step (#48).

Next, in FIG. 14, explanation will be given to a case that the tip part of the nozzle part 39 of the adsorption nozzle assembly 10 dose not exist at the appropriate position (No in #37), namely such as a case that the difference between the position of the driving shaft measured in step #36 and the position of the driving shaft at the start of mounting is determined not to be within the appropriate range. In this case, first, it is determined whether or not the position of the driving shaft 45 measured in step #36 is located on the upper side of the position of the driving shaft at the start of mounting (#42).

Namely, when it is so determined that the position of the driving shaft 45 measured in step #36 is located on the upper side of the position of the driving shaft at the start of mounting (Yes in #42), this is a case that the components are remained on the tip part of the nozzle part 39 of the adsorption nozzle assembly 10, and this is the case so determined that the components are brought back due to mounting error, thus outputting a signal showing that bringing back of the components occurs. Subsequently, when this output is received, the components are discarded (#40), and re-try storing process is determined (#39), and the processing is moved to the processing of the next step (#48).

When it is so determined that the position of the driving shaft 45 measured in step #36 is below the position of the driving shaft at the start of mounting (No in #42), this case is determined to be a tip part abnormality of the nozzle part 39. A case of breakage and bending of the tip part of the nozzle part 39, and a case that the nozzle part 39 is not returned to an original position from an upward escape position due to poor sliding of the nozzle part 39 are given as specific examples of the tip part abnormality of the nozzle part 39. In this case, a flag of poor nozzle is set ON (#45).

Finally, explanation will be given to a case of discarding the components (#40) and a case of performing the determination of production continuation and determining that the adsorption/mounting of the components are not continued in the processing when the flag of the poor nozzle is set ON (#45). As described above, by the determination of production continuation, whether or not the production is continued or stopped is determined, with reference to the production condition data, and when the production is determined to be stopped individually, an NG message is displayed (#46) and the automated operation of the component mounting apparatus is stopped. In addition, when the flag of poor nozzle is set ON, the processing is moved to the processing of a load cell measurement for checking the condition of the nozzle part (#47).

Figure 17:
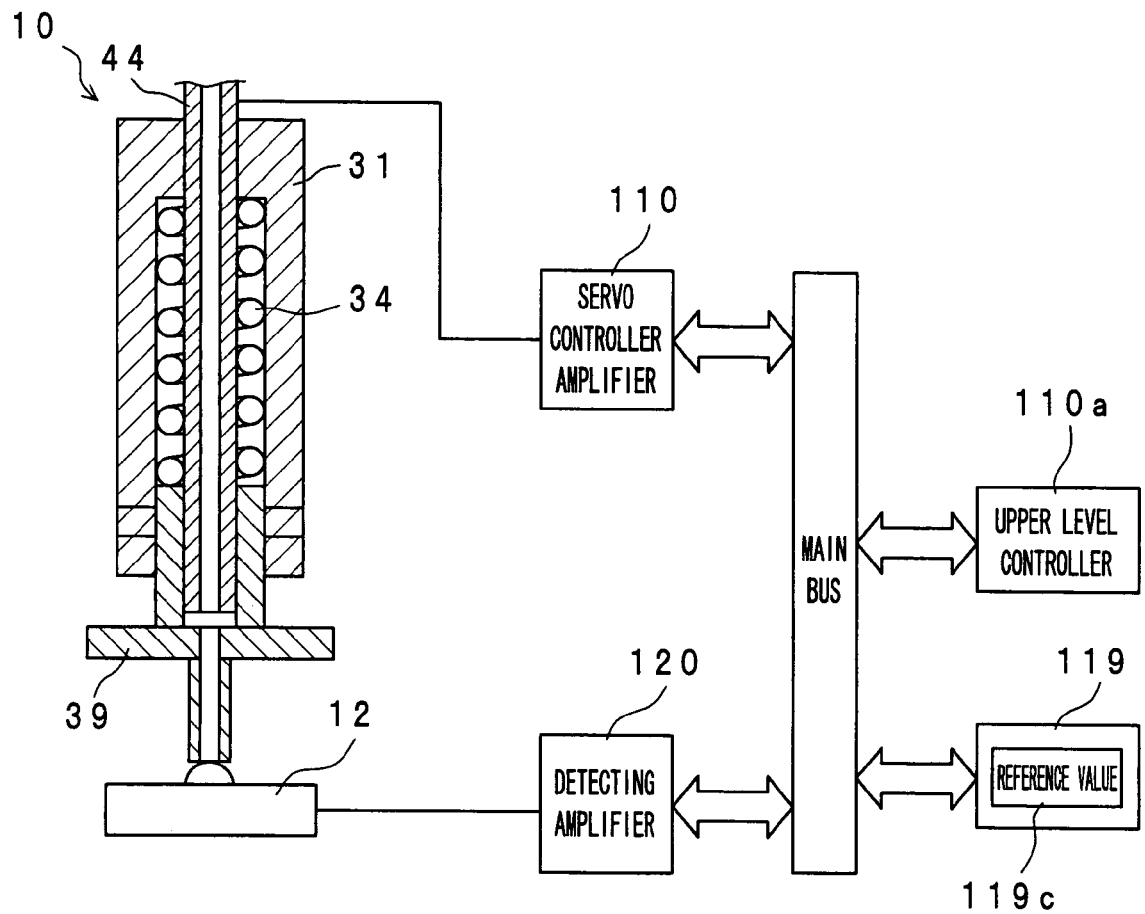
FIG. 17 is a block diagram of the control circuit for measuring a load cell.

The load cell measurement will be explained. FIG. 17 is a block diagram of the control circuit for performing the load cell measurement. The control circuit for performing the load cell measurement constitutes a part of the control circuit in the control calculation part 100, and includes a detecting amplifier 120 for calculating the output value from the load cell. In addition, the control circuit of FIG. 17 is partially the same as the control circuit for controlling to drive the shaft-type linear motor as shown in FIG. 8A.

The load cell measurement particularly determines whether or not the poor sliding of the nozzle part occurs. Specifically, after the head part 4 is moved so that the adsorption nozzle assembly 10 is positioned in an upper part of the load cell 12, the adsorption nozzle assembly 10 is descended and the nozzle part 39 is descended to the load cell 12, and the output value of the load cell 12 is measured.

Figure 18A:
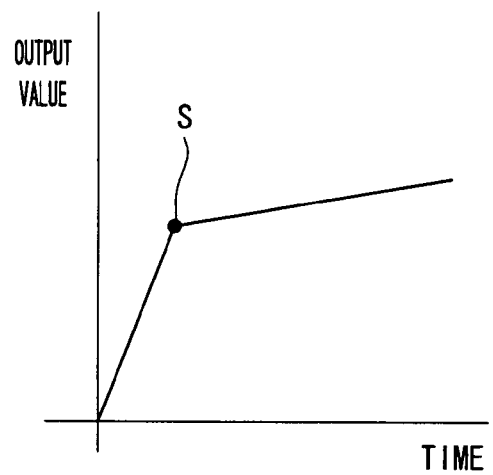
FIG. 18A is a graph of an aging change of a static output.
Figure 18B:
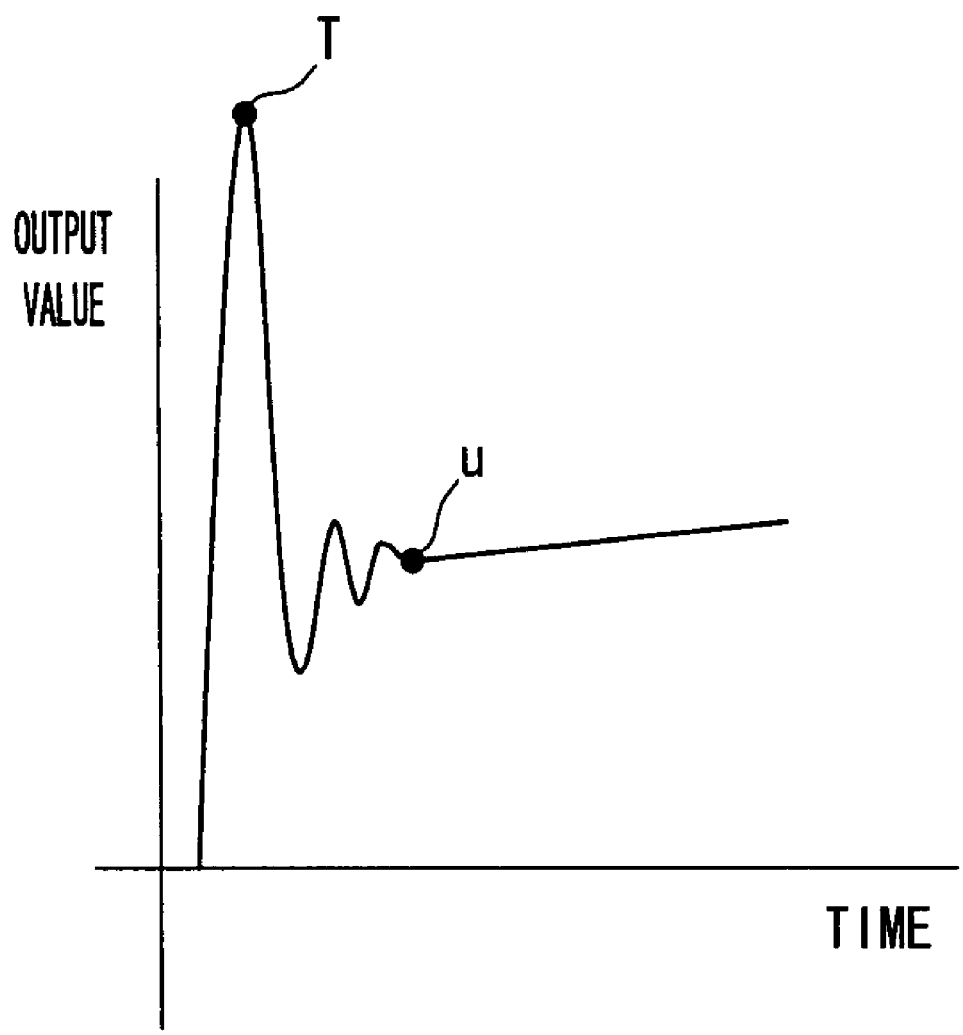
FIG. 18B is a graph of an aging change of a dynamic output.

As measurement conditions, the output value (static output) of the load cell when the nozzle parts 39 are slowly descended to the load cell 12, and the output value (dynamic output) under the same operation condition as that of the adsorption/mounting are measured. The static output changes with time in such a manner that the output value is linearly increased, a change rate of the output value is changed at a prescribed value, and the output value is further linearly increased. In this case, a constant value of the point S shown in FIG. 18A is defined as a measurement value of the static output. Meanwhile, as shown in FIG. 18B, the dynamic output changes with time in such a manner that a large value is suddenly taken first, thereafter vibrating, and finally the output value is linearly increased. In this case, a maximum value of the point T and a constant value of the point U as shown in FIG. 18B are defined as the measurement values of the dynamic output. Note that as a measurement value, it is preferable to select an average value of measurements of a plurality of times (such as 3 to 5 times) to level a variation in the measurement.

These three measurement values are compared to a reference value 119c previously stored in the storage part 119. The reference value 119c is the output value of the load cell 12 of the aforementioned three points measured in an initial state such as exchanging the nozzle part 39. This reference value 119c and the measurement value are compared, and whether or not this measurement value is within a previously set allowable range is calculated. When the measurement value becomes the value beyond this allowable range, the signal showing poor nozzle part 39 is outputted in the processing of the load cell measurement.

In addition, the timing of executing the processing of the load cell measurement is executed as the processing that continues to the determination of production continuation as shown in this embodiment, and an arbitrary timing can be set by setting the production condition data, for every set time (for example, for every two hours), when a rate of generating adsorption error exceeds a prescribed value, and when the nozzle part 39 is exchanged.

As described above, according to this embodiment, the positional detection of six nozzle parts can be performed by a pair of light projector and light receiver, thus making it possible to realize a simple component mounting apparatus at a low cost. In addition, since it has the nozzle corrected value 119d in consideration of the difference of the position in a direction of the optical axis, detection can be made for each nozzle part with high accuracy.

Further, by detecting the nozzle part during mounting operation, various problems such as breakage and bending of the nozzle part, and bringing back of the components due to mounting error can be solved, thus making it possible to improve the accuracy of mounting.

Further, by detecting a pressing force of the nozzle by the load cell, by both of the dynamic output and the static output, the poor sliding of the nozzle can be detected with further accuracy.

Note that the present invention is not limited to the aforementioned embodiments, and can be embodied in various kinds of modes. In the above-described embodiment, when the condition of the nozzle is detected, the detection of a nozzle condition is performed by detecting the position of the driving shaft 45 in the sensor units 49a and 49b at the time of detecting the original point of the light receiver 61 (CCD line sensor) for detecting the tip part of the nozzle. However, it may be so constituted that when the position of the driving shaft 45 detected in the sensor units 49a and 49b is within an inspection reference value for detecting the height of the nozzle, the height of the tip part of the nozzle can be detected by the light receiver 61 (CCD line sensor). Note that in this case, the adsorption nozzle assembly is different by a distance from the light receiver, and therefore it is preferable to correct the height of the tip part of the nozzle. Therefore, by previously measuring a jig having already known thickness and dimension, the corrected value is prepared for each adsorption nozzle assembly, and it is preferable to detect the thickness and dimension of the components and the condition of the nozzle, based on this corrected value.

In addition, for example, in the above-described embodiment, the light receiver 61 uses the CCD line sensor, but the embodiment may take other constitution. For example, the nozzle part can be detected by using a sensor for measuring only whether or not the light is received, based on switching of the received light and shielded light.

Note that by suitably combining arbitrary embodiments out of the aforementioned various embodiments, each advantage can be exhibited respectively.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

INDUSTRIAL APPLICABILITY

The present invention relates to a method and an apparatus for mounting components on a substrate, and is used in a manufacture of a mounting substrate used in each kind of electronic apparatus such as a cellular phone terminal, etc.

The invention claimed is:

1. A method for detecting a condition of a nozzle member of a multi-nozzle type component mounting head, the method comprising:
providing the multi-nozzle type component mounting head, the multi-nozzle type component mounting head including:
a plurality of nozzle members having movable parts respectively movable vertically and linearly arranged in a direction crossing a direction of the vertical movement, and nozzles, for holding components, connected to lower ends of the movable parts, respectively;
a nozzle moving apparatus for vertically moving each of the plurality of nozzle members individually;

a height detector for detecting vertical positions of the movable parts of the plurality of nozzle members;

a light projector provided on a straight line on which the plurality of nozzle members are arranged and on opposite sides of the nozzles;

a light receiver for receiving light from the light projector; and a load cell for outputting an output signal in accordance with a pressing strength of one of the nozzles by being pressed by the one of the nozzles, wherein the one of the nozzles can escape upward in a case when a tip part of the one of the nozzles is urged downward and pressed to an upper side;

moving the plurality of nozzle members by the nozzle moving apparatus so that all of the nozzles retreat in an upper side of an optical path, and making the light receiver receive the light from the light projector without intercepting the light therefrom;

moving, using the nozzle moving apparatus, an arbitrary one of the plurality of nozzle members to descend so that a tip part of the nozzle of the arbitrary one of the plurality of nozzle members intercepts the light projected by the light projector and shields the light receiver from receiving the light projected by the light projector;

detecting, using the height detector, a position of the arbitrary one of the plurality of nozzle members by measuring a vertical directional position of the movable part of the arbitrary one of the plurality of nozzle members connected to the nozzle of the arbitrary one of the plurality of nozzle members, at a timing when the light receiver detects that light reception and light shielding from the light projected by the light projector are switched by the tip part of the nozzle of the arbitrary one of the plurality of nozzle members;

repeating descent and detection for all of the plurality of nozzle members existing between the light projector and light receiver, and detecting the positions of all of the plurality of nozzle members; and storing, as reference positional information, information on a vertical position from the height detector at a timing when the light receiver detects that shielding of the light from the light projector is switched for each of the nozzles without performing an operation of holding a component;

storing, as inspection positional information, information of a vertical position from the height detector at a timing when the light receiver detects that shielding of the light from the light projector is switched for the each of the nozzles while performing an operation of holding the component;

calculating a nozzle moving amount when the one of the nozzles takes out the component, a nozzle moving amount for mounting, on a substrate, the component held by the one of the nozzles, and a thickness of the component held by the one of the nozzles, based on the reference positional information and the inspectional positional information; and measuring, using the height detector, information on a vertical position of the one of the nozzles at a timing when reception and shielding of the light are switched by the one of the nozzles after the one of the nozzles is made to descend to the substrate for mounting, on the substrate, the component held by the one of the nozzles, wherein when the difference between the measured vertical position of the one of the nozzles and the reference positional information of the one of the nozzles is equal to or greater than a determined value and the measured vertical position of the one of the nozzles is at a lower level position than the reference positional information, it is determined that the one of the nozzles is pressed against the load cell and an output value of the load cell is measured, and wherein when the difference between a previously stored output value from the load cell and the output value from the load cell is not within a prescribed range, it is determined that the escape of the one of the nozzles does not function.

\* \* \* \* \*